US008049997B2

(12) United States Patent
Miyauchi et al.

(10) Patent No.: US 8,049,997 B2
(45) Date of Patent: Nov. 1, 2011

(54) MAGNETORESISTIVE ELEMENT INCLUDING A PAIR OF FREE LAYERS COUPLED TO A PAIR OF SHIELD LAYERS

(75) Inventors: Daisuke Miyauchi, Tokyo (JP); Yoshihiro Tsuchiya, Tokyo (JP); Tsutomu Chou, Tokyo (JP); Shinji Hara, Tokyo (JP); Takahiko Machita, Tokyo (JP); Koji Shimazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 589 days.

(21) Appl. No.: 12/285,069

(22) Filed: Sep. 29, 2008

(65) Prior Publication Data

US 2010/0079917 A1   Apr. 1, 2010

(51) Int. Cl.
*G11B 5/39* (2006.01)
(52) U.S. Cl. .................... 360/319; 360/324.12
(58) Field of Classification Search .............. 360/319, 360/324–324.2
See application file for complete search history.

(56) References Cited

U.S. PATENT DOCUMENTS

| 6,169,647 | B1 | 1/2001 | Mao et al. | |
| 6,496,335 | B2* | 12/2002 | Gill | 360/319 |
| 6,724,583 | B2 | 4/2004 | Seigler et al. | |
| 7,035,062 | B1 | 4/2006 | Mao et al. | |
| 7,615,996 | B1* | 11/2009 | Machita et al. | 324/252 |
| 7,706,108 | B2* | 4/2010 | Gill | 360/319 |
| 7,881,023 | B2* | 2/2011 | Machita et al. | 360/324.12 |
| 7,961,438 | B2* | 6/2011 | Mizuno et al. | 360/319 |
| 7,974,048 | B2* | 7/2011 | Shimazawa et al. | 360/319 |
| 2009/0135529 | A1* | 5/2009 | Shimazawa et al. | 360/319 |
| 2009/0279213 | A1* | 11/2009 | Wu et al. | 360/319 |
| 2009/0296283 | A1* | 12/2009 | Mizuno et al. | 360/319 |
| 2010/0027168 | A1* | 2/2010 | Chou et al. | 360/319 |
| 2010/0039734 | A1* | 2/2010 | Hara et al. | 360/319 |
| 2010/0067148 | A1* | 3/2010 | Tsuchiya et al. | 360/245.3 |
| 2010/0149689 | A1* | 6/2010 | Tsuchiya et al. | 360/234.3 |
| 2010/0232073 | A1* | 9/2010 | Chou et al. | 360/324 |
| 2011/0051291 | A1* | 3/2011 | Miyauchi et al. | 360/245.3 |
| 2011/0069417 | A1* | 3/2011 | Kawamori et al. | 360/319 |
| 2011/0091744 | A1* | 4/2011 | Kawamori et al. | 428/810 |

FOREIGN PATENT DOCUMENTS

| JP | A-09-274712 | 10/1997 |
| JP | A-2002-298314 | 10/2002 |
| JP | A-2004-39869 | 2/2004 |
| JP | A-2007-109807 | 4/2007 |

* cited by examiner

*Primary Examiner* — Will J Klimowicz
(74) *Attorney, Agent, or Firm* — Oliff & Berridge, PLC

(57) ABSTRACT

A first shield portion located below an MR stack includes a first main shield layer, a first antiferromagnetic layer, and a first magnetization controlling layer including a first ferromagnetic layer exchange-coupled to the first antiferromagnetic layer. A second shield portion located on the MR stack includes a second main shield layer, a second antiferromagnetic layer, and a second magnetization controlling layer including a second ferromagnetic layer exchange-coupled to the second antiferromagnetic layer. The MR stack includes two free layers magnetically coupled to the two magnetization controlling layers. Only one of the two magnetization controlling layers includes a third ferromagnetic layer that is antiferromagnetically exchange-coupled to the first or second ferromagnetic layer through a nonmagnetic middle layer. The first shield portion includes an underlayer disposed on the first main shield layer, and the first antiferromagnetic layer is disposed on the underlayer.

14 Claims, 11 Drawing Sheets

MAGNETORESISTIVE ELEMENT INCLUDING A PAIR OF FREE LAYERS COUPLED TO A PAIR OF SHIELD LAYERS

BACKGROUND OF THE INVENTION

1. Field of the Invention

The present invention relates to a magnetoresistive element, and to a thin-film magnetic head, a head assembly and a magnetic disk drive each including the magnetoresistive element.

2. Description of the Related Art

Performance improvements in thin-film magnetic heads have been sought as areal recording density of magnetic disk drives has increased. A widely used type of thin-film magnetic head is a composite thin-film magnetic head that has a structure in which a write head and a read head are stacked on a substrate, the write head incorporating an induction-type electromagnetic transducer for writing, the read head incorporating a magnetoresistive element (hereinafter, also referred to as MR element) for reading.

Examples of the MR element include a GMR (giant magnetoresistive) element utilizing a giant magnetoresistive effect, and a TMR (tunneling magnetoresistive) element utilizing a tunneling magnetoresistive effect.

Read heads are required to have characteristics of high sensitivity and high output. As the read heads that satisfy such requirements, those incorporating spin-valve GMR elements or TMR elements have been mass-produced.

A spin-valve GMR element and a TMR element each typically include a free layer, a pinned layer, a spacer layer disposed between the free layer and the pinned layer, and an antiferromagnetic layer disposed on a side of the pinned layer farther from the spacer layer. The free layer is a ferromagnetic layer having a magnetization that changes its direction in response to a signal magnetic field. The pinned layer is a ferromagnetic layer having a magnetization in a fixed direction. The antiferromagnetic layer is a layer that fixes the direction of the magnetization of the pinned layer by means of exchange coupling with the pinned layer. The spacer layer is a nonmagnetic conductive layer in a spin-valve GMR element, and is a tunnel barrier layer in a TMR element.

Examples of a read head incorporating a GMR element include one having a CIP (current-in-plane) structure in which a current used for detecting a signal magnetic field (hereinafter referred to as a sense current) is fed in the direction parallel to the planes of the layers constituting the GMR element, and one having a CPP (current-perpendicular-to-plane) structure in which the sense current is fed in a direction intersecting the planes of the layers constituting the GMR element, such as the direction perpendicular to the planes of the layers constituting the GMR element.

Read heads each incorporate a pair of shields sandwiching the MR element. The distance between the two shields is called a read gap length. Recently, with an increase in recording density, there have been increasing demands for a reduction in track width and a reduction in read gap length in read heads.

As an MR element capable of reducing the read gap length, there has been proposed an MR element including two ferromagnetic layers each functioning as a free layer, and a spacer layer disposed between the two ferromagnetic layers (such an MR element is hereinafter referred to as an MR element of the three-layer structure), as disclosed in U.S. Pat. No. 7,035,062 B1, for example. In the MR element of the three-layer structure, the two ferromagnetic layers have magnetizations that are in directions antiparallel to each other and parallel to the track width direction when no external magnetic field is applied to those ferromagnetic layers, and that change their directions in response to an external magnetic field.

In a read head incorporating an MR element of the three-layer structure, a bias magnetic field is applied to the two ferromagnetic layers. The bias magnetic field changes the directions of the magnetizations of the two ferromagnetic layers so that each of the directions forms an angle of approximately 45 degrees with respect to the track width direction. As a result, the relative angle between the directions of the magnetizations of the two ferromagnetic layers becomes approximately 90 degrees. When a signal magnetic field sent from the recording medium is applied to the read head, the relative angle between the directions of the magnetizations of the two ferromagnetic layers changes, and as a result, the resistance of the MR element changes. For this read head, it is possible to detect the signal magnetic field by detecting the resistance of the MR element. The read head incorporating an MR element of the three-layer structure allows a much greater reduction in read gap length, compared with a read head incorporating a conventional GMR element.

For an MR element of the three-layer structure, one of methods for directing the magnetizations of the two ferromagnetic layers antiparallel to each other when no external magnetic field is applied thereto is to antiferromagnetically couple the two ferromagnetic layers to each other by the RKKY interaction through the spacer layer.

Disadvantageously, however, this method imposes limitation on the material and thickness of the spacer layer to allow antiferromagnetic coupling between the two ferromagnetic layers. In addition, since this method limits the material of the spacer layer to a nonmagnetic conductive material, it is not applicable to a TMR element that is expected to have a high output, or a GMR element of a current-confined-path type CPP structure, which is an MR element also expected to have a high output and having a spacer layer that includes a portion allowing the passage of currents and a portion intercepting the passage of currents. The above-described method further has a disadvantage that, even if it could be possible to direct the magnetizations of the two ferromagnetic layers antiparallel to each other, it is difficult to direct those magnetizations parallel to the track width direction with reliability.

U.S. Pat. No. 6,169,647 B1 discloses a method of weakly fixing the directions of the magnetizations of the two ferromagnetic layers of an MR element of the three-layer structure so that the magnetizations of the two ferromagnetic layers are directed antiparallel to each other, through the use of two antiferromagnetic layers disposed on the respective sides of the two ferromagnetic layers farther from the spacer layer.

However, this method has a disadvantage that a reduction in read gap length is difficult due to the presence of the two antiferromagnetic layers. In addition, while this method requires that the exchange coupling magnetic fields generated from the two antiferromagnetic layers be directed antiparallel to each other, it is very difficult to subject the two antiferromagnetic layers to such a heat treatment (annealing) that this requirement can be satisfied.

OBJECT AND SUMMARY OF THE INVENTION

It is an object of the present invention to provide a magnetoresistive element including two free layers whose magnetizations change their directions in response to an external magnetic field, and a spacer layer disposed between the two free layers, the magnetoresistive element being capable of directing the magnetizations of the two free layers antiparallel to each other when no external magnetic field is applied, without making use of antiferromagnetic coupling between the two free layers through the spacer layer, and to provide a thin-film magnetic head, a head assembly and a magnetic disk drive each including such a magnetoresistive element.

A magnetoresistive element of the present invention includes a first shield portion, a second shield portion, and an MR stack disposed between the first and second shield portions. The MR stack and the second shield portion are stacked in this order on the first shield portion. The first shield portion includes a first main shield layer, and a first exchange coupling shield layer disposed between the first main shield layer and the MR stack. The second shield portion includes a second main shield layer, and a second exchange coupling shield layer disposed between the second main shield layer and the MR stack.

The first exchange coupling shield layer includes: an underlayer made of a nonmagnetic conductive material and disposed on the first main shield layer; a first antiferromagnetic layer disposed on the underlayer; and a first magnetization controlling layer disposed between the first antiferromagnetic layer and the MR stack. The second exchange coupling shield layer includes: a second antiferromagnetic layer; and a second magnetization controlling layer disposed between the second antiferromagnetic layer and the MR stack. The MR stack includes: a first free layer that is magnetically coupled to the first magnetization controlling layer and thereby has a magnetization in a controlled direction; a second free layer that is magnetically coupled to the second magnetization controlling layer and thereby has a magnetization in a controlled direction; and a spacer layer made of a nonmagnetic material and disposed between the first and second free layers.

The first magnetization controlling layer includes a first ferromagnetic layer exchange-coupled to the first antiferromagnetic layer. The second magnetization controlling layer includes a second ferromagnetic layer exchange-coupled to the second antiferromagnetic layer. Only one of the first and second magnetization controlling layers further includes: a nonmagnetic middle layer made of a nonmagnetic conductive material and disposed between the first or second ferromagnetic layer and the MR stack; and a third ferromagnetic layer disposed between the nonmagnetic middle layer and the MR stack and antiferromagnetically exchange-coupled to the first or second ferromagnetic layer through the nonmagnetic middle layer.

The present invention has a feature that the underlayer is disposed on the first main shield layer and the first antiferromagnetic layer is disposed on the underlayer. This feature serves to increase an exchange coupling magnetic field generated between the first antiferromagnetic layer and the first ferromagnetic layer in both of the case where the first magnetization controlling layer includes the nonmagnetic middle layer and the third ferromagnetic layer and the case where the second magnetization controlling layer includes the nonmagnetic middle layer and the third ferromagnetic layer. According to the present invention, in the case where the first magnetization controlling layer includes the nonmagnetic middle layer and the third ferromagnetic layer, it is possible to also increase an exchange coupling magnetic field generated between the first ferromagnetic layer and the third ferromagnetic layer.

In the magnetoresistive element of the present invention, the underlayer may contain at least one of Ta and Ru.

In the magnetoresistive element of the present invention, the nonmagnetic middle layer may contain at least one of Ru, Rh, Ir, Cr, Cu, Ag, Au, Pt and Pd.

In the magnetoresistive element of the present invention, the second exchange coupling shield layer may further include a nonmagnetic cap layer made of a nonmagnetic conductive material and disposed between the second antiferromagnetic layer and the second main shield layer.

In the magnetoresistive element of the present invention, the MR stack may further include: a first coupling layer disposed between the first magnetization controlling layer and the first free layer and magnetically coupling the first magnetization controlling layer and the first free layer to each other; and a second coupling layer disposed between the second magnetization controlling layer and the second free layer and magnetically coupling the second magnetization controlling layer and the second free layer to each other. Each of the first and second coupling layers may include a nonmagnetic conductive layer, and two magnetic layers sandwiching the nonmagnetic conductive layer.

The magnetoresistive element of the present invention may further include a bias magnetic field applying layer disposed between the first and second shield portions so as to be adjacent to the MR stack in a direction orthogonal to a direction in which the layers constituting the MR stack are stacked, the bias magnetic field applying layers applying a bias magnetic field to the first and second free layers so that the magnetizations of the first and second free layers change their directions compared with a state in which no bias magnetic field is applied to the first and second free layers.

The bias magnetic field applying layer may apply the bias magnetic field to the first and second free layers so that the magnetizations of the first and second free layers are directed orthogonal to each other.

The first magnetization controlling layer may have a top surface and a bottom surface, and the top surface may include a first portion touching the MR stack and a second portion that is located closer to the bottom surface than is the first portion so that a recess is formed below the bias magnetic field applying layer. In this case, the magnetoresistive element may further include an insulating film disposed on the second portion and the bias magnetic field applying layer may be disposed on the insulating film.

In the magnetoresistive element of the present invention, the first magnetization controlling layer may include the nonmagnetic middle layer and the third ferromagnetic layer, and the third ferromagnetic layer may have a top surface that forms the top surface of the first magnetization controlling layer, and a bottom surface that touches the nonmagnetic middle layer. In this case, the recess may have a depth equal to or smaller than one-half of a distance between the first portion and the bottom surface of the third ferromagnetic layer.

In the magnetoresistive element of the present invention, the second magnetization controlling layer may include the nonmagnetic middle layer and the third ferromagnetic layer, and the first ferromagnetic layer may have a top surface that forms the top surface of the first magnetization controlling layer, and a bottom surface that touches the first antiferromagnetic layer. In this case, the recess may have a depth equal to or smaller than one-half of a distance between the first portion and the bottom surface of the first ferromagnetic layer.

A thin-film magnetic head of the present invention includes: a medium facing surface that faces toward a recording medium; and the magnetoresistive element of the invention disposed near the medium facing surface to detect a signal magnetic field sent from the recording medium.

A head assembly of the present invention includes: a slider including the thin-film magnetic head of the invention and disposed to face toward the recording medium; and a supporter flexibly supporting the slider.

A magnetic disk drive of the present invention includes: a slider including the thin-film magnetic head of the invention and disposed to face toward a recording medium that is driven to rotate; and an alignment device supporting the slider and aligning the slider with respect to the recording medium.

According to the present invention, the first ferromagnetic layer of the first magnetization controlling layer is exchange-coupled to the first antiferromagnetic layer, whereby the direction of the magnetization of the first ferromagnetic layer is set. The second ferromagnetic layer of the second magnetization controlling layer is exchange-coupled to the second antiferromagnetic layer, whereby the direction of the magnetization of the second ferromagnetic layer is set. The third ferromagnetic layer included in only one of the first and second magnetization controlling layers is antiferromagnetically exchange-coupled to the first or second ferromagnetic layer through the nonmagnetic middle layer, whereby the direction of the magnetization of the third ferromagnetic layer is set. The first free layer is magnetically coupled to the first magnetization controlling layer and the direction of the magnetization of the first free layer is thereby controlled. The second free layer is magnetically coupled to the second magnetization controlling layer and the direction of the magnetization of the second free layer is thereby controlled. As a result, according to the present invention, it is possible to direct the magnetizations of the two free layers antiparallel to each other when no external magnetic field is applied, without making use of antiferromagnetic coupling between the two free layers through the spacer layer.

In addition, according to the present invention, the underlayer is disposed on the first main shield layer and the first antiferromagnetic layer is disposed on the underlayer. This serves to increase an exchange coupling magnetic field generated between the first antiferromagnetic layer and the first ferromagnetic layer in both of the case where the first magnetization controlling layer includes the nonmagnetic middle layer and the third ferromagnetic layer and the case where the second magnetization controlling layer includes the nonmagnetic middle layer and the third ferromagnetic layer. According to the present invention, in the case where the first magnetization controlling layer includes the nonmagnetic middle layer and the third ferromagnetic layer, it is possible to also increase an exchange coupling magnetic field generated between the first ferromagnetic layer and the third ferromagnetic layer.

According to the present invention, it is possible to increase the exchange coupling magnetic field generated between the first antiferromagnetic layer and the first ferromagnetic layer as described above. This makes it possible that, even in the case where the top surface of the first magnetization controlling layer is provided with a recess located below the bias magnetic field applying layer, the thickness of the first or third ferromagnetic layer is prevented from being reduced too much at the area where the recess is formed. Consequently, it becomes possible to allow the first or third ferromagnetic layer to fully perform its function as a shield.

Other and further objects, features and advantages of the present invention will appear more fully from the following description.

DETAILED DESCRIPTION OF THE PREFERRED EMBODIMENTS

First Embodiment

Figure 13:
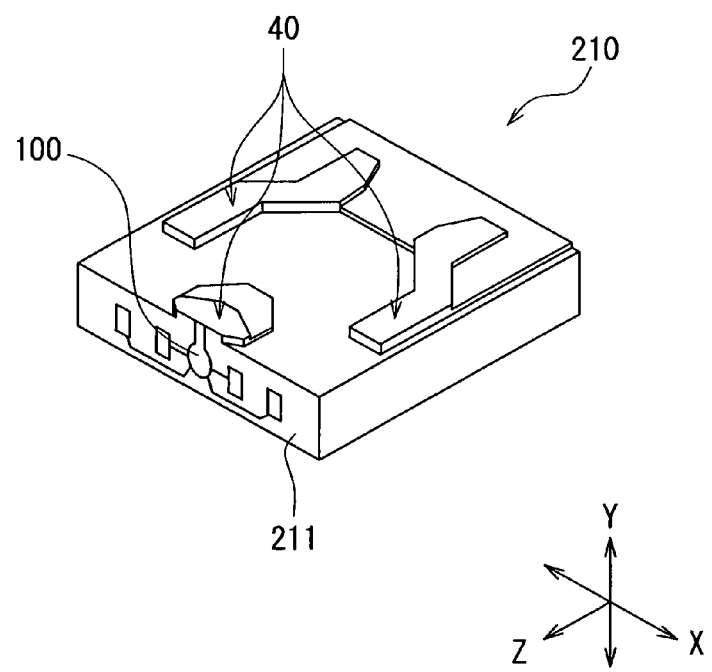
FIG. 13 is a perspective view of a slider including the thin-film magnetic head of the first embodiment of the invention.

Embodiments of the present invention will now be described in detail with reference to the drawings. Reference is first made to FIG. 13 to describe a slider 210 including a thin-film magnetic head of a first embodiment of the invention. In a magnetic disk drive, the slider 210 is placed to face toward a circular-plate-shaped recording medium (a magnetic disk platter) that is to be driven to rotate. In FIG. 13, the X direction is across the tracks of the recording medium, the Y direction is perpendicular to the surface of the recording medium, and the Z direction is the direction of travel of the recording medium as seen from the slider 210. The X, Y and Z directions are orthogonal to one another. The slider 210 has a base body 211. The base body 211 is nearly hexahedron-shaped. One of the six surfaces of the base body 211 is designed to face toward the surface of the recording medium. At this one of the six surfaces, there is formed a medium facing surface 40 to face toward the recording medium. When the recording medium rotates and travels in the Z direction, an airflow passing between the recording medium and the slider 210 causes a lift below the slider 210 in the Y direction of FIG. 13. This lift causes the slider 210 to fly over the surface of the recording medium. The thin-film magnetic head 100 of the present embodiment is formed near the air-outflow-side end (the end located at the lower left of FIG. 13) of the slider 210.

Figure 4:
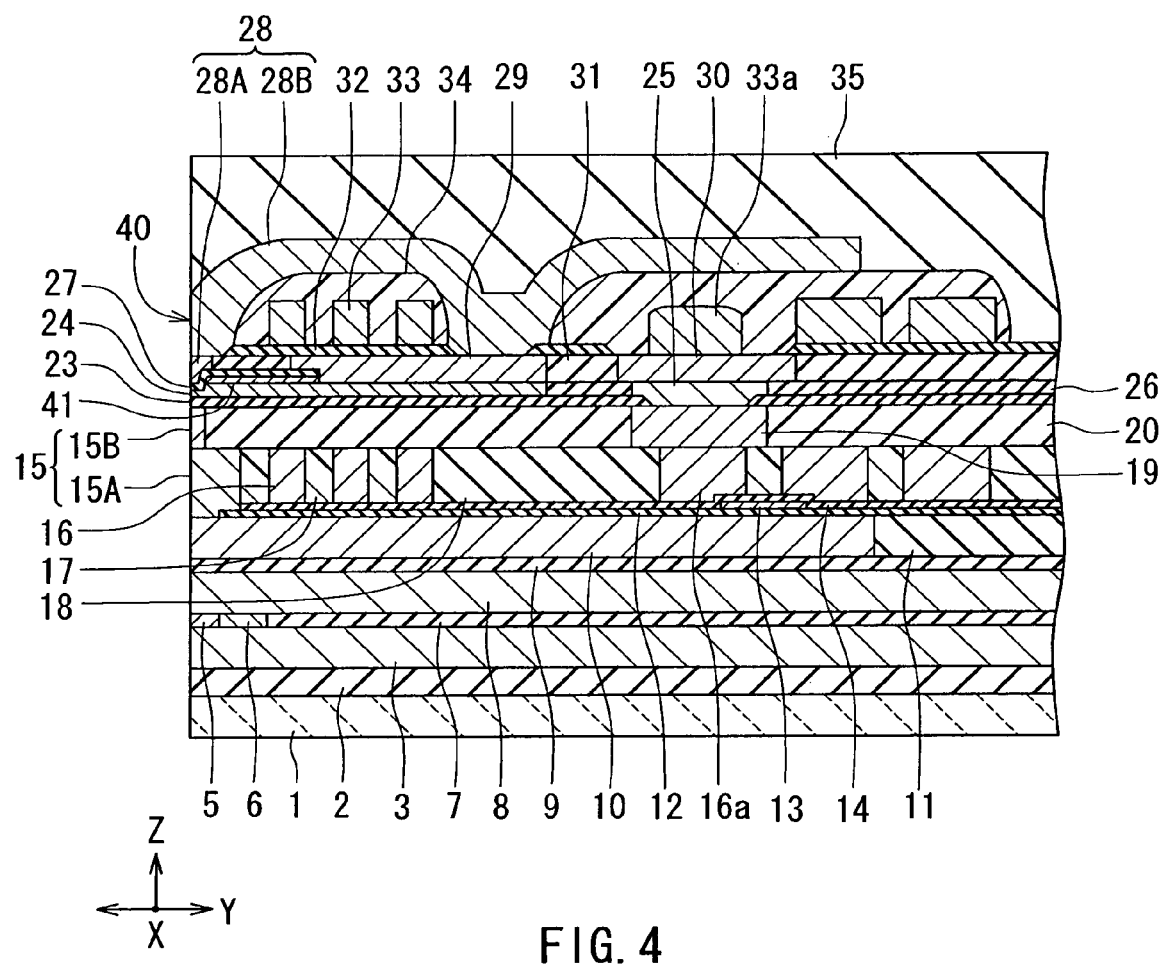
FIG. 4 is a cross-sectional view showing the configuration of a thin-film magnetic head of the first embodiment of the invention.
Figure 5:
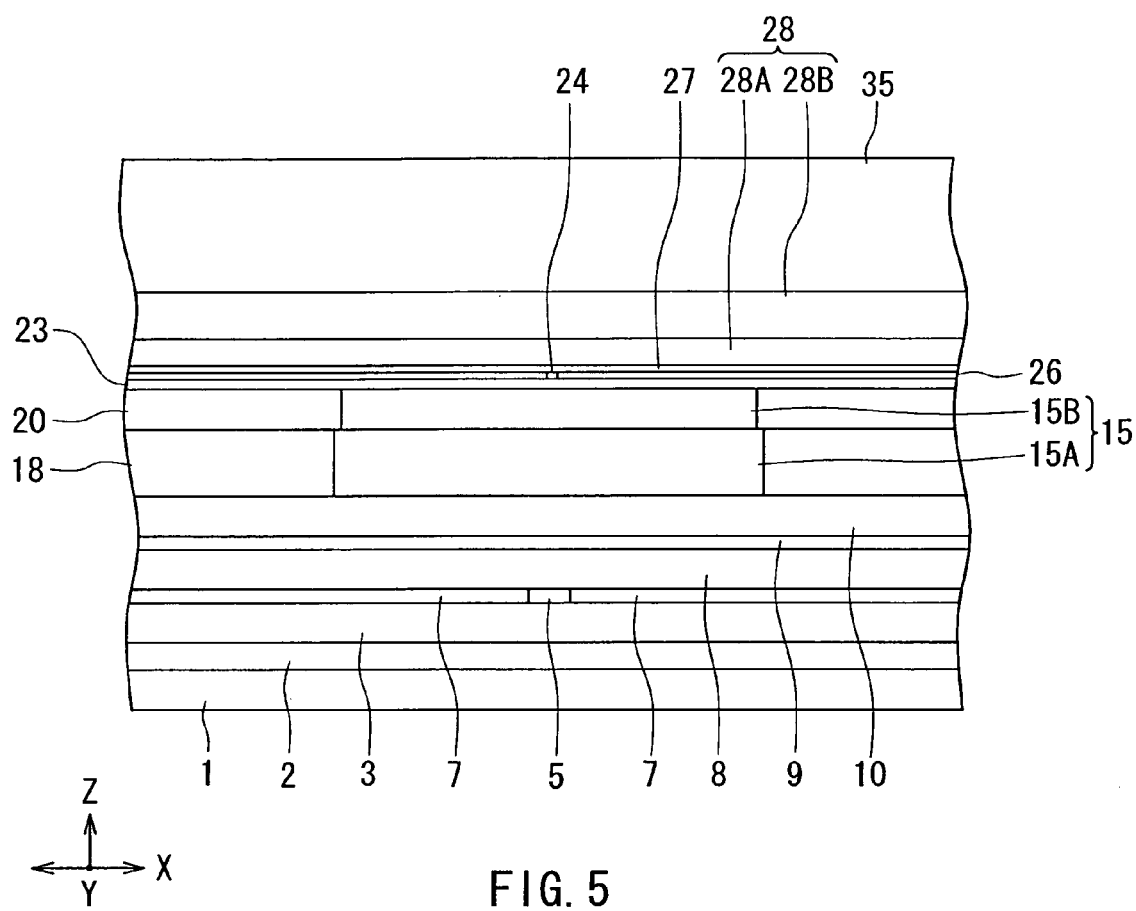
FIG. 5 is a front view showing the medium facing surface of the thin-film magnetic head of the first embodiment of the invention.

Reference is now made to FIG. 4 and FIG. 5 to describe the configuration of the thin-film magnetic head of the present embodiment. FIG. 4 is a cross-sectional view showing the configuration of the thin-film magnetic head. FIG. 5 is a front view showing the medium facing surface of the thin-film magnetic head. Note that FIG. 4 shows a cross section perpendicular to the medium facing surface and the top surface of the substrate. The X, Y and Z directions shown in FIG. 13 are also shown in FIG. 4 and FIG. 5. In FIG. 4 the X direction is orthogonal to the Y and Z directions. In FIG. 5 the Y direction is orthogonal to the X and Z directions.

As shown in FIG. 4, the thin-film magnetic head of the present embodiment has the medium facing surface 40 that faces toward the recording medium. As shown in FIG. 4 and FIG. 5, the thin-film magnetic head includes: a substrate 1 made of a ceramic material such as aluminum oxide-titanium carbide ($Al_2O_3$—TiC); an insulating layer 2 made of an insulating material such as alumina ($Al_2O_3$) and disposed on the substrate 1; a first read shield portion 3 disposed on the insulating layer 2; and an MR stack 5, a bias magnetic field applying layer 6 and an insulating refill layer 7 that are disposed on the first read shield portion 3.

The MR stack 5 has a bottom surface touching the first read shield portion 3, a top surface opposite to the bottom surface, a front end face located in the medium facing surface 40, a rear end face opposite to the front end face, and two side surfaces that are opposed to each other in the track width direction (the X direction of FIG. 5). The bias magnetic field applying layer 6 is disposed adjacent to the rear end face of the MR stack 5, with an insulating film (not shown) provided between the MR stack 5 and the layer 6. The insulating refill layer 7 is disposed around the MR stack 5 and the bias magnetic field applying layer 6.

The thin-film magnetic head further includes: a second read shield portion 8 disposed on the MR stack 5, the bias magnetic field applying layer 6 and the insulating refill layer 7; and a separating layer 9 made of a nonmagnetic material such as alumina and disposed on the second read shield portion 8.

The portion from the first read shield portion 3 to the second read shield portion 8 constitutes a magnetoresistive element (hereinafter referred to as MR element) of the present embodiment. The MR element constitutes a read head of the thin-film magnetic head of the present embodiment. The configuration of the MR element will be described in detail later.

The thin-film magnetic head further includes: a magnetic layer 10 made of a magnetic material and disposed on the separating layer 9; and an insulating layer 11 made of an insulating material such as alumina and disposed around the magnetic layer 10. The magnetic layer 10 has an end face located in the medium facing surface 40. The magnetic layer 10 and the insulating layer 11 have flattened top surfaces.

The thin-film magnetic head further includes: an insulating film 12 disposed on the magnetic layer 10 and the insulating layer 11; a heater 13 disposed on the insulating film 12; and an insulating film 14 disposed on the insulating film 12 and the heater 13 such that the heater 13 is sandwiched between the insulating films 12 and 14. The function and material of the heater 13 will be described later. The insulating films 12 and 14 are made of an insulating material such as alumina.

The thin-film magnetic head further includes a first write shield 15 disposed on the magnetic layer 10. The first write shield 15 includes: a first layer 15A disposed on the magnetic layer 10; and a second layer 15B disposed on the first layer 15A. The first layer 15A and the second layer 15B are made of a magnetic material. Each of the first layer 15A and the second layer 15B has an end face located in the medium facing surface 40. In the example shown in FIG. 4, the length of the second layer 15B taken in the direction perpendicular to the medium facing surface 40 (the Y direction of FIG. 4) is smaller than the length of the first layer 15A taken in the direction perpendicular to the medium facing surface 40. However, the length of the second layer 15B taken in the direction perpendicular to the medium facing surface 40 may be equal to or greater than the length of the first layer 15A taken in the direction perpendicular to the medium facing surface 40.

The thin-film magnetic head further includes: a coil 16 made of a conductive material and disposed on the insulating film 14; an insulating layer 17 that fills the space between the coil 16 and the first layer 15A and the space between every adjacent turns of the coil 16; and an insulating layer 18 disposed around the first layer 15A, the coil 16 and the insulating layer 17. The coil 16 is planar spiral-shaped. The coil 16 includes a connecting portion 16a that is a portion near an inner end of the coil 16 and connected to another coil described later. The insulating layer 17 is made of photoresist, for example. The insulating layer 18 is made of alumina, for example. The first layer 15A, the coil 16, the insulating layer 17 and the insulating layer 18 have flattened top surfaces.

The thin-film magnetic head further includes: a connecting layer 19 made of a conductive material and disposed on the connecting portion 16a; and an insulating layer 20 made of an insulating material such as alumina and disposed around the second layer 15B and the connecting layer 19. The connecting layer 19 may be made of the same material as the second layer 15B. The second layer 15B, the connecting layer 19 and the insulating layer 20 have flattened top surfaces.

The thin-film magnetic head further includes a first gap layer 23 disposed on the second layer 15B, the connecting layer 19 and the insulating layer 20. The first gap layer 23 has an opening formed in a region corresponding to the top surface of the connecting layer 19. The first gap layer 23 is made of a nonmagnetic insulating material such as alumina.

The thin-film magnetic head further includes: a pole layer 24 made of a magnetic material and disposed on the first gap layer 23; a connecting layer 25 made of a conductive material and disposed on the connecting layer 19; and an insulating layer 26 made of an insulating material such as alumina and disposed around the pole layer 24 and the connecting layer 25. The pole layer 24 has an end face located in the medium facing surface 40. The connecting layer 25 is connected to the connecting layer 19 through the opening of the first gap layer 23. The connecting layer 25 may be made of the same material as the pole layer 24.

The thin-film magnetic head further includes a nonmagnetic layer 41 made of a nonmagnetic material and disposed on part of the top surface of the pole layer 24. The nonmagnetic layer 41 is made of an inorganic insulating material or a metal material, for example. Examples of the inorganic insulating material to be used for the nonmagnetic layer 41 include alumina and $SiO_2$. Examples of the metal material to be used for the nonmagnetic layer 41 include Ru and Ti.

The thin-film magnetic head further includes a second gap layer 27 disposed on part of the pole layer 24 and on the nonmagnetic layer 41. A portion of the top surface of the pole layer 24 apart from the medium facing surface 40 and the top surface of the connecting layer 25 are not covered with the nonmagnetic layer 41 and the second gap layer 27. The second gap layer 27 is made of a nonmagnetic material such as alumina.

The thin-film magnetic head further includes a second write shield 28 disposed on the second gap layer 27. The second write shield 28 includes: a first layer 28A disposed adjacent to the second gap layer 27; and a second layer 28B disposed on a side of the first layer 28A opposite to the second gap layer 27 and connected to the first layer 28A. The first layer 28A and the second layer 28B are made of a magnetic material. Each of the first layer 28A and the second layer 28B has an end face located in the medium facing surface 40.

The thin-film magnetic head further includes: a yoke layer 29 made of a magnetic material and disposed on a portion of the pole layer 24 away from the medium facing surface 40; a connecting layer 30 made of a conductive material and disposed on the connecting layer 25; and an insulating layer 31 made of an insulating material such as alumina and disposed around the first layer 28A, the yoke layer 29 and the connecting layer 30. The yoke layer 29 and the connecting layer 30 may be made of the same material as the first layer 28A. The first layer 28A, the yoke layer 29, the connecting layer 30 and the insulating layer 31 have flattened top surfaces.

The thin-film magnetic head further includes an insulating layer 32 made of an insulating material such as alumina and disposed on the yoke layer 29 and the insulating layer 31. The insulating layer 32 has an opening for exposing the top surface of the first layer 28A, an opening for exposing a portion of the top surface of the yoke layer 29 near an end thereof farther from the medium facing surface 40, and an opening for exposing the top surface of the connecting layer 30.

The thin-film magnetic head further includes a coil 33 made of a conductive material and disposed on the insulating layer 32. The coil 33 is planar spiral-shaped. The coil 33 includes a connecting portion 33a that is a portion near an inner end of the coil 33 and connected to the connecting portion 16a of the coil 16. The connecting portion 33a is connected to the connecting layer 30, and connected to the connecting portion 16a through the connecting layers 19, 25 and 30.

The thin-film magnetic head further includes an insulating layer 34 disposed to cover the coil 33. The insulating layer 34 is made of photoresist, for example. The second layer 28B of the second write shield 28 is disposed on the first layer 28A, the yoke layer 29 and the insulating layer 34, and connects the first layer 28A and the yoke layer 29 to each other.

The thin-film magnetic head further includes an overcoat layer 35 made of an insulating material such as alumina and disposed to cover the second layer 28B. The portion from the magnetic layer 10 to the second layer 28B constitutes a write head. The base body 211 of FIG. 13 is mainly composed of the substrate 1 and the overcoat layer 35 of FIG. 4.

As described so far, the thin-film magnetic head includes the medium facing surface 40 that faces toward the recording medium, the read head, and the write head. The read head and the write head are stacked on the substrate 1. The read head is disposed backward along the direction of travel of the recording medium (the Z direction) (in other words, disposed closer to an air-inflow end of the slider), while the write head is disposed forward along the direction of travel of the recording medium (the Z direction) (in other words, disposed closer to an air-outflow end of the slider). The thin-film magnetic head writes data on the recording medium through the use of the write head, and reads data stored on the recording medium through the use of the read head.

As shown in FIG. 4, the read head includes: the first read shield portion 3; the second read shield portion 8; the MR stack 5 disposed between the first and second read shield portions 3 and 8 near the medium facing surface 40 in order to detect a signal magnetic field sent from the recording medium; the bias magnetic field applying layer 6; and the insulating refill layer 7. The bias magnetic field applying layer 6 is disposed adjacent to the rear end face of the MR stack 5, with an insulating film (not shown) provided between the MR stack 5 and the layer 6. The insulating refill layer 7 is disposed around the MR stack 5 and the bias magnetic field applying layer 6. The MR stack 5 is either a TMR element or a GMR element of the CPP structure. A sense current is fed to the MR stack 5 in a direction intersecting the planes of layers constituting the MR stack 5, such as the direction perpendicular to the planes of the layers constituting the MR stack 5. The resistance of the MR stack 5 changes in response to an external magnetic field, that is, a signal magnetic field sent from the recording medium. The resistance of the MR stack 5 can be determined from the sense current. It is thus possible, using the read head, to read data stored on the recording medium.

The write head includes the magnetic layer 10, the first write shield 15, the coil 16, the first gap layer 23, the pole layer 24, the nonmagnetic layer 41, the second gap layer 27, the second write shield 28, the yoke layer 29, and the coil 33. The first write shield 15 is located closer to the substrate 1 than is the second write shield 28. The pole layer 24 is located closer to the substrate 1 than is the second write shield 28.

The coils 16 and 33 generate a magnetic field that corresponds to data to be written on the recording medium. The pole layer 24 has an end face located in the medium facing surface 40, allows a magnetic flux corresponding to the magnetic field generated by the coils 16 and 33 to pass, and generates a write magnetic field used for writing the data on the recording medium by means of a perpendicular magnetic recording system.

The first write shield 15 is made of a magnetic material, and has an end face located in the medium facing surface 40 at a position backward of the end face of the pole layer 24 along the direction of travel of the recording medium (the Z direction). The first gap layer 23 is made of a nonmagnetic material, has an end face located in the medium facing surface 40, and is disposed between the first write shield 15 and the pole layer 24. In the present embodiment, the first write shield 15 includes the first layer 15A disposed on the magnetic layer 10, and the second layer 15B disposed on the first layer 15A. Part of the coil 16 is located on a side of the first layer 15A so as to pass through the space between the magnetic layer 10 and the pole layer 24.

The magnetic layer 10 has a function of returning a magnetic flux that has been generated from the end face of the pole layer 24 and has magnetized the recording medium. FIG. 4 shows an example in which the magnetic layer 10 has an end face located in the medium facing surface 40. However, since the magnetic layer 10 is connected to the first write shield 15 having an end face located in the medium facing surface 40, the magnetic layer 10 may have an end face that is closer to the medium facing surface 40 and located at a distance from the medium facing surface 40.

In the medium facing surface 40, the end face of the first write shield 15 (the end face of the second layer 15B) is located backward of the end face of the pole layer 24 along the direction of travel of the recording medium (the Z direction) (in other words, located closer to the air-inflow end of the slider) with a predetermined small distance provided therebetween by the first gap layer 23. The distance between the end face of the pole layer 24 and the end face of the first write shield 15 in the medium facing surface 40 is preferably within a range of 0.05 to 0.7 μm, or more preferably within a range of 0.1 to 0.3 μm.

The first write shield 15 takes in a magnetic flux that is generated from the end face of the pole layer 24 located in the medium facing surface 40 and that expands in directions except the direction perpendicular to the plane of the recording medium, and thereby prevents this flux from reaching the recording medium. It is thereby possible to improve the recording density.

The second write shield 28 is made of a magnetic material, and has an end face located in the medium facing surface 40 at a position forward of the end face of the pole layer 24 along the direction of travel of the recording medium (the Z direction). The second gap layer 27 is made of a nonmagnetic material, has an end face located in the medium facing surface 40, and is disposed between the second write shield 28 and the pole layer 24. In the present embodiment, the second write shield 28 includes: the first layer 28A disposed adjacent to the second gap layer 27; and the second layer 28B disposed on a side of the first layer 28A opposite to the second gap layer 27 and connected to the first layer 28A. Part of the coil 33 is disposed to pass through the space surrounded by the pole layer 24 and the second write shield 28. The second write shield 28 is connected to a portion of the yoke layer 29 away from the medium facing surface 40. The second write shield 28 is thus connected to a portion of the pole layer 24 away from the medium facing surface 40 through the yoke layer 29. The pole layer 24, the second write shield 28 and the yoke layer 29 form a magnetic path that allows a magnetic flux corresponding to the magnetic field generated by the coil 33 to pass therethrough.

In the medium facing surface 40, the end face of the second write shield 28 (the end face of the first layer 28A) is located forward of the end face of the pole layer 24 along the direction of travel of the recording medium (the Z direction) (in other words, located closer to the air-outflow end of the slider) with a predetermined small distance provided therebetween by the second gap layer 27. The distance between the end face of the pole layer 24 and the end face of the second write shield 28 in the medium facing surface 40 is preferably equal to or smaller than 200 nm, or more preferably within a range of 25 to 50 nm, so that the second write shield 28 can fully exhibit its function as a shield.

The position of the end of a bit pattern to be written on the recording medium is determined by the position of an end of the pole layer 24 closer to the second gap layer 27 in the medium facing surface 40. The second write shield 28 takes in a magnetic flux that is generated from the end face of the pole layer 24 located in the medium facing surface 40 and that expands in directions except the direction perpendicular to the plane of the recording medium, and thereby prevents this flux from reaching the recording medium. It is thereby possible to improve the recording density. Furthermore, the second write shield 28 takes in a disturbance magnetic field applied from outside the thin-film magnetic head to the thin-film magnetic head. It is thereby possible to prevent erroneous writing on the recording medium caused by the disturbance magnetic field intensively taken into the pole layer 24. The second write shield 28 also has a function of returning a magnetic flux that has been generated from the end face of the pole layer 24 and has magnetized the recording medium.

FIG. 4 shows an example in which neither the magnetic layer 10 nor the first write shield 15 is connected to the pole layer 24. However, the magnetic layer 10 may be connected to a portion of the pole layer 24 away from the medium facing surface 40. The coil 16 is not an essential component of the write head and can be dispensed with. In the example shown in FIG. 4, the yoke layer 29 is disposed on the pole layer 24, or in other words, disposed forward of the pole layer 24 along the direction of travel of the recording medium (the Z direction) (or in still other words, disposed closer to the air-outflow end of the slider). However, the yoke layer 29 may be disposed below the pole layer 24, or in other words, disposed backward of the pole layer 24 along the direction of travel of the recording medium (the Z direction) (or in still other words, disposed closer to the air-inflow end of the slider).

The heater 13 is provided for heating the components of the write head including the pole layer 24 so as to control the distance between the recording medium and the end face of the pole layer 24 located in the medium facing surface 40. Two leads that are not shown are connected to the heater 13. For example, the heater 13 is formed of a NiCr film or a layered film made up of a Ta film, a NiCu film and a Ta film. The heater 13 generates heat by being energized through the two leads, and thereby heats the components of the write head. As a result, the components of the write head expand and the end face of the pole layer 24 located in the medium facing surface 40 thereby gets closer to the recording medium.

While FIG. 4 and FIG. 5 show a write head for a perpendicular magnetic recording system, the write head of the present embodiment may be one for a longitudinal magnetic recording system.

A method of manufacturing the thin-film magnetic head of the present embodiment will now be outlined. In the method of manufacturing the thin-film magnetic head of the embodiment, first, components of a plurality of thin-film magnetic heads are formed on a single substrate (wafer) to thereby fabricate a substructure in which pre-slider portions each of which will later become a slider are aligned in a plurality of rows. Next, the substructure is cut to form a slider aggregate including a plurality of pre-slider portions aligned in a row. Next, a surface formed in the slider aggregate by cutting the substructure is lapped to thereby form the medium facing surfaces 40 of the pre-slider portions included in the slider aggregate. Next, flying rails are formed in the medium facing surfaces 40. Next, the slider aggregate is cut so as to separate the plurality of pre-slider portions from one another, whereby a plurality of sliders are formed, each of the sliders including the thin-film magnetic head.

Figure 1:
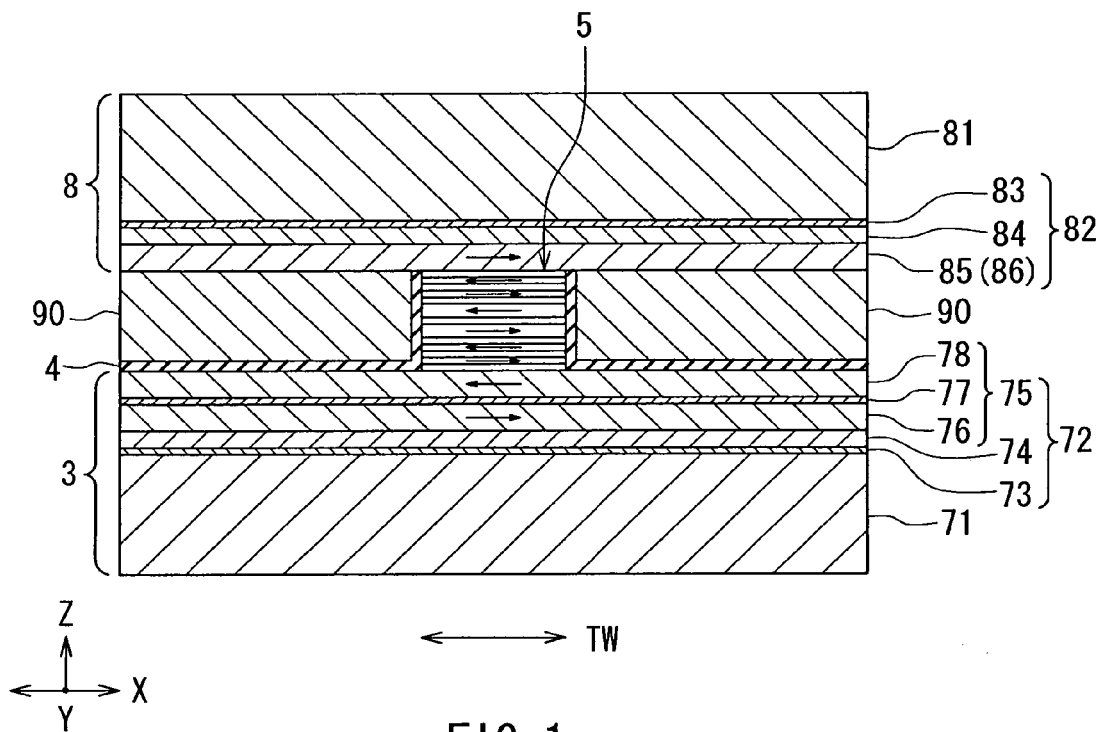
FIG. 1 is a cross-sectional view showing a cross section of a magnetoresistive element of a first embodiment of the invention parallel to the medium facing surface.
Figure 2:
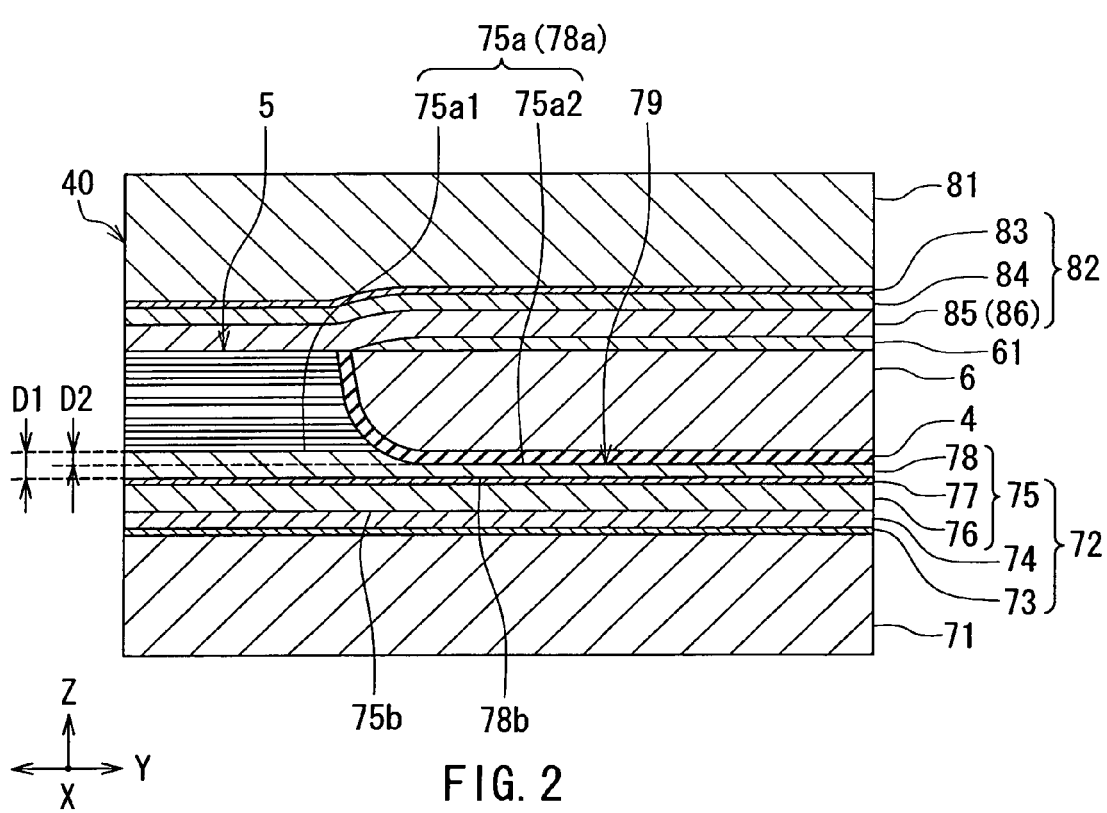
FIG. 2 is a cross-sectional view showing a cross section of the magnetoresistive element of FIG. 1 perpendicular to the medium facing surface and the top surface of the substrate.
Figure 3:
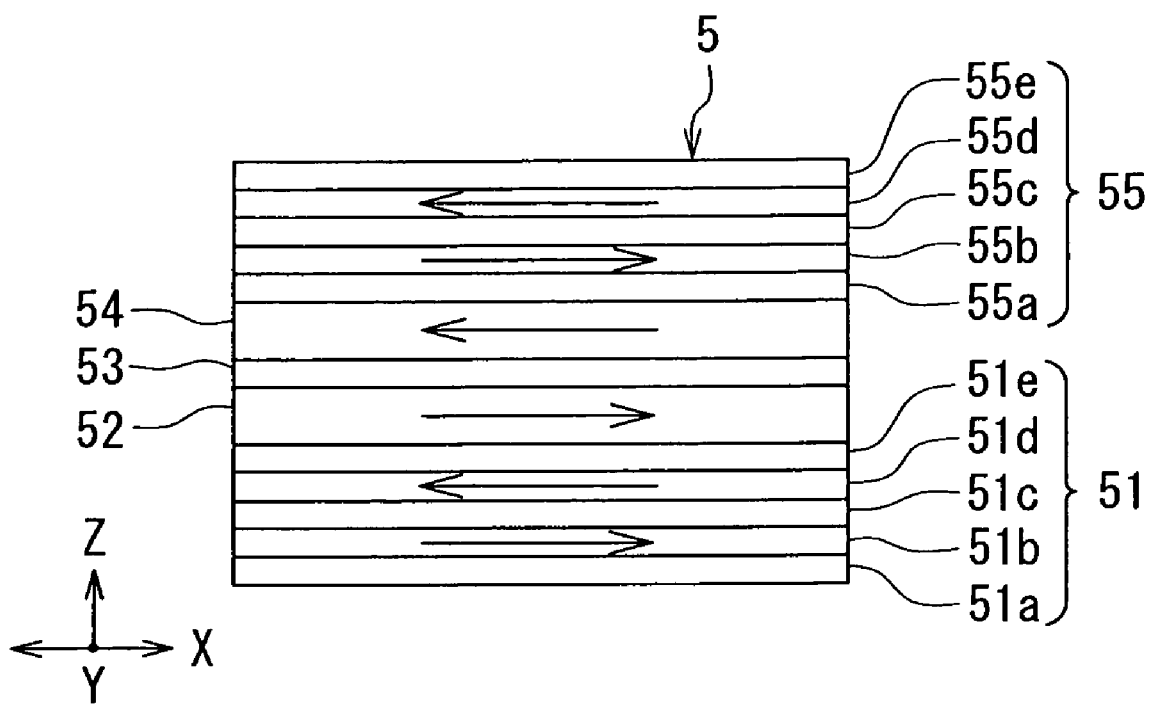
FIG. 3 is an enlarged cross-sectional view of the MR stack of FIG. 1.

The configuration of the MR element of the present embodiment will now be described in detail with reference to FIG. 1 to FIG. 3. FIG. 1 is a cross-sectional view showing a cross section of the MR element parallel to the medium facing surface 40. FIG. 2 is a cross-sectional view showing a cross section of the MR element perpendicular to the medium facing surface 40 and the top surface of the substrate 1. FIG. 3 is an enlarged cross-sectional view of the MR stack of FIG. 1. The X, Y and Z directions shown in FIG. 13 are also shown in FIG. 1 to FIG. 3. In FIG. 1 and FIG. 3 the Y direction is orthogonal to the X and Z directions. In FIG. 2 the X direction is orthogonal to the Y and Z directions. In FIG. 1 the arrow TW indicates the track width direction. The track width direction TW is the same as the X direction.

The MR element includes the first read shield portion 3 and the second read shield portion 8, and includes the MR stack 5, an insulating film 4, two nonmagnetic metal layers 90, the bias magnetic field applying layer 6, a protection layer 61 and the insulating refill layer 7 that are disposed between the first and second read shield portions 3 and 8. The MR stack 5 and the second read shield portion 8 are stacked in this order on the first read shield portion 3. The first read shield portion 3 corresponds to the first shield portion of the present invention. The second read shield portion 8 corresponds to the second shield portion of the present invention.

The planar shape (the shape as seen from above) of the MR stack 5 is smaller than that of each of the read shield portions 3 and 8. The insulating film 4 covers the two side surfaces and the rear end face of the MR stack 5, and also covers the top surface of the first read shield portion 3 except the area on which the MR stack 5 is disposed. The insulating film 4 is formed of an insulating material such as alumina. The two nonmagnetic metal layers 90 are disposed adjacent to the two side surfaces of the MR stack 5, respectively, with the insulating film 4 located between the MR stack 5 and the nonmagnetic metal layers 90. The nonmagnetic metal layers 90 are formed of a nonmagnetic metal material such as Cr. The bias magnetic field applying layer 6 is disposed adjacent to the rear end face of the MR stack 5, with the insulating film 4 located between the MR stack 5 and the bias magnetic field applying layer 6. The bias magnetic field applying layer 6 is formed mainly of a hard magnetic material (permanent magnet material) such as CoPt or CoCrPt. The protection layer 61 is disposed between the bias magnetic field applying layer 6 and the second read shield portion 8. The protection layer 61 is formed of a nonmagnetic conductive material such as NiCr. The insulating refill layer 7 is disposed around the nonmagnetic metal layers 90 and the bias magnetic field applying layer 6. The insulating refill layer 7 is formed of an insulating material such as alumina.

The first read shield portion 3 includes a first main shield layer 71, and a first exchange coupling shield layer 72 disposed between the first main shield layer 71 and the MR stack 5. The first exchange coupling shield layer 72 includes: an underlayer 73 made of a nonmagnetic conductive material and disposed on the first main shield layer 71; a first antiferromagnetic layer 74 disposed on the underlayer 73; and a first magnetization controlling layer 75 disposed between the first antiferromagnetic layer 74 and the MR stack 5.

The first magnetization controlling layer 75 includes: a first ferromagnetic layer 76 exchange-coupled to the first antiferromagnetic layer 74; a nonmagnetic middle layer 77 made of a nonmagnetic conductive material and disposed between the first ferromagnetic layer 76 and the MR stack 5; and a third ferromagnetic layer 78 disposed between the nonmagnetic middle layer 77 and the MR stack 5. The third ferromagnetic layer 78 is antiferromagnetically exchange-coupled to the first ferromagnetic layer 76 by the RKKY interaction through the nonmagnetic middle layer 77.

The second read shield portion 8 includes a second main shield layer 81, and a second exchange coupling shield layer 82 disposed between the second main shield layer 81 and the MR stack 5. The second exchange coupling shield layer 82 includes: a second antiferromagnetic layer 84; a second magnetization controlling layer 85 disposed between the second antiferromagnetic layer 84 and the MR stack 5; and a nonmagnetic cap layer 83 made of a nonmagnetic conductive material and disposed between the second antiferromagnetic layer 84 and the second main shield layer 81. The second magnetization controlling layer 85 includes only a second ferromagnetic layer 86 that is exchange-coupled to the second antiferromagnetic layer 84.

The first main shield layer 71, the first ferromagnetic layer 76, the third ferromagnetic layer 78, the second main shield layer 81 and the second ferromagnetic layer 86 are each formed of a soft magnetic material such as NiFe, CoFe, CoFeB, CoFeNi or FeN. The first main shield layer 71, the first ferromagnetic layer 76, the third ferromagnetic layer 78, the second main shield layer 81 and the second ferromagnetic layer 86 each function as a shield to absorb an unwanted magnetic flux.

The underlayer 73 contains at least one of Ra and Ru, for example. The nonmagnetic cap layer 83 is formed of NiCr, for example.

The antiferromagnetic layers 74 and 84 are each formed of an antiferromagnetic material. The antiferromagnetic material to be used for the antiferromagnetic layers 74 and 84 may be a non-heat-induced antiferromagnetic material or a heat-induced antiferromagnetic material. Examples of the non-heat-induced antiferromagnetic material include a Mn alloy that has a γ phase, such as FeMn or IrMn. Examples of the heat-induced antiferromagnetic material include a Mn alloy that has a regular crystal structure, such as PtMn or NiMn.

The nonmagnetic middle layer 77 contains at least one of Ru, Rh, Ir, Cr, Cu, Ag, Au, Pt, and Pd, for example.

In the first exchange coupling shield layer 72, the first ferromagnetic layer 76 is exchange-coupled to the first antiferromagnetic layer 74, whereby the first ferromagnetic layer 76 is brought into a single magnetic domain state so that the magnetization of the first ferromagnetic layer 76 is directed to a certain direction. Similarly, in the second exchange coupling shield layer 82, the second ferromagnetic layer 86 is exchange-coupled to the second antiferromagnetic layer 84, whereby the second ferromagnetic layer 86 is brought into a single magnetic domain state so that the magnetization of the second ferromagnetic layer 86 is directed to a certain direction. The directions of the magnetizations of the first and second ferromagnetic layers 76 and 86 are set by annealing in a magnetic field, and are determined by the direction of the magnetic field at that time. Therefore, the magnetizations of the first and second ferromagnetic layers 76 and 86 are in the same direction. Specifically, the directions of the magnetizations of the first and second ferromagnetic layers 76 and 86 are the same and are parallel to the track width direction TW.

In the first exchange coupling shield layer 72, the third ferromagnetic layer 78 is antiferromagnetically exchange-coupled to the first ferromagnetic layer 76 through the nonmagnetic middle layer 77. As a result, the magnetizations of the first and third ferromagnetic layers 76 and 78 are directed antiparallel to each other, and the third ferromagnetic layer 78 is brought into a single magnetic domain state so that the magnetization of the third ferromagnetic layer 78 is directed to a certain direction. Consequently, the magnetizations of the second and third ferromagnetic layers 86 and 78 are directed antiparallel to each other.

As shown in FIG. 3, the MR stack 5 includes a first free layer 52, a second free layer 54, and a spacer layer 53 made of a nonmagnetic material and disposed between the free layers 52 and 54. Each of the free layers 52 and 54 is a ferromagnetic layer. The MR stack 5 further includes a first coupling layer 51 disposed between the first magnetization controlling layer 75 and the first free layer 52, and a second coupling layer 55 disposed between the second free layer 54 and the second magnetization controlling layer 85.

The first free layer 52 is magnetically coupled to the third ferromagnetic layer 78 of the first magnetization controlling layer 75. The second free layer 54 is magnetically coupled to the second ferromagnetic layer 86 of the second magnetization controlling layer 85. The first free layer 52 and the second free layer 54 have magnetizations that are in directions antiparallel to each other when any external magnetic field other than a magnetic field resulting from the first and second magnetization controlling layers 75 and 85 is not applied to the first and second free layers 52 and 54, and that change their directions in response to an external magnetic field other than the magnetic field resulting from the first and second magnetization controlling layers 75 and 85. Each of the free layers 52 and 54 is formed of a ferromagnetic material having a low coercivity, such as NiFe, CoFe, CoFeB, CoFeNi, or FeN.

When there is no magnetic field applied to the MR element from outside the MR element, any magnetic field applied to the free layers 52 and 54, other than the bias magnetic field generated by the bias magnetic field applying layer 6, results from the magnetization controlling layers 75 and 85. Therefore, the state in which any external magnetic field other than a magnetic field resulting from the magnetization controlling layers 75 and 85 is not applied to the free layers 52 and 54 is a state in which any bias magnetic field generated by the bias magnetic field applying layer 6 is not applied to the free layers 52 and 54 when there is no magnetic field applied to the MR element from outside the MR element.

In the case where the MR stack 5 is a TMR element, the spacer layer 53 is a tunnel barrier layer. The spacer layer 53 in this case is formed of an insulating material such as alumina, $SiO_2$ or MgO. In the case where the MR stack 5 is a GMR element of the CPP structure, the spacer layer 53 is a nonmagnetic conductive layer. The spacer layer 53 in this case is formed of, for example, a nonmagnetic conductive material such as Ru, Rh, Ir, Re, Cr, Zr or Cu, or an oxide semiconductor material such as ZnO, $In_2O_3$ or $SnO_2$.

The first coupling layer 51 is a layer for magnetically coupling the first magnetization controlling layer 75 and the first free layer 52 to each other. The first coupling layer 51 also serves to adjust the distance between the first magnetization controlling layer 75 and the first free layer 52. The first coupling layer 51 includes a nonmagnetic conductive layer 51a, a magnetic layer 51b, a nonmagnetic conductive layer 51c, a magnetic layer 51d and a nonmagnetic conductive layer 51e that are stacked in this order on the third ferromagnetic layer 78 of the first magnetization controlling layer 75. The nonmagnetic conductive layer 51e touches the bottom surface of the first free layer 52. The nonmagnetic conductive layers 51a, 51c and 51e are each formed of a nonmagnetic conductive material containing at least one of Ru, Rh, Ir, Cr, Cu, Ag, Au, Pt and Pd, for example. The magnetic layers 51b and 51d are each formed of a magnetic material such as NiFe, CoFe, CoFeB, CoFeNi or FeN.

The third ferromagnetic layer 78 of the first magnetization controlling layer 75 and the magnetic layer 51b are antiferromagnetically coupled to each other by the RKKY interaction through the nonmagnetic conductive layer 51a. The magnetizations of the third ferromagnetic layer 78 and the magnetic layer 51b are therefore directed antiparallel to each other. The magnetic layer 51b and the magnetic layer 51d are antiferromagnetically coupled to each other by the RKKY interaction through the nonmagnetic conductive layer 51c. The magnetizations of the magnetic layer 51b and the magnetic layer 51d are therefore directed antiparallel to each other. The magnetic layer 51d and the first free layer 52 are antiferromagnetically coupled to each other by the RKKY interaction through the nonmagnetic conductive layer 51e. The magnetizations of the magnetic layer 51d and the first free layer 52 are therefore directed antiparallel to each other. As a result, the magnetizations of the first free layer 52 and the third ferromagnetic layer 78 are directed antiparallel to each other. In this way, the first magnetization controlling layer 74 controls the magnetization of the first free layer 52.

The second coupling layer 55 is a layer for magnetically coupling the second magnetization controlling layer 85 and the second free layer 54 to each other. The second coupling layer 55 also serves to adjust the distance between the second magnetization controlling layer 85 and the second free layer 54. The second coupling layer 55 includes a nonmagnetic conductive layer 55a, a magnetic layer 55b, a nonmagnetic conductive layer 55c, a magnetic layer 55d, and a nonmagnetic conductive layer 55e that are stacked in this order on the second free layer 54. The nonmagnetic conductive layer 55e touches the bottom surface of the second magnetization controlling layer 85, that is, the bottom surface of the second ferromagnetic layer 86. The nonmagnetic conductive layers 55a, 55c and 55e are each formed of a nonmagnetic conductive material containing at least one of Ru, Rh, Ir, Cr, Cu, Ag, Au, Pt and Pd, for example. The magnetic layers 55b and 55d are each formed of a magnetic material such as NiFe, CoFe, CoFeB, CoFeNi or FeN.

The structure of the second coupling layer 55 is vertically symmetrical with the structure of the first coupling layer 51. Each of the coupling layers 51 and 55 includes a nonmagnetic conductive layer, and two magnetic layers sandwiching the nonmagnetic conductive layer.

The second ferromagnetic layer 86 of the second magnetization controlling layer 85 and the magnetic layer 55d are antiferromagnetically coupled to each other by the RKKY interaction through the nonmagnetic conductive layer 55e. The magnetizations of the second ferromagnetic layer 86 and the magnetic layer 55d are therefore directed antiparallel to each other. The magnetic layer 55d and the magnetic layer 55b are antiferromagnetically coupled to each other by the RKKY interaction through the nonmagnetic conductive layer 55c. The magnetizations of the magnetic layer 55d and the magnetic layer 55b are therefore directed antiparallel to each other. The magnetic layer 55b and the second free layer 54 are antiferromagnetically coupled to each other by the RKKY interaction through the nonmagnetic conductive layer 55a. The magnetizations of the magnetic layer 55b and the second free layer 54 are therefore directed antiparallel to each other. As a result, the magnetizations of the second free layer 54 and the second ferromagnetic layer 86 are directed antiparallel to each other. In this way, the second magnetization controlling layer 85 controls the magnetization of the second free layer 54.

Thus, in the present embodiment, the directions of the magnetizations of the third ferromagnetic layer 78 and the second ferromagnetic layer 86 are antiparallel to each other, the directions of the magnetizations of the first free layer 52 and the third ferromagnetic layer 78 are also antiparallel to each other, and the directions of the magnetizations of the second free layer 54 and the second ferromagnetic layer 86 are also antiparallel to each other. Consequently, the directions of the magnetizations of the first free layer 52 and the second free layer 54 are antiparallel to each other.

The configuration of each of the first and second coupling layers 51 and 55 is not limited to a five-layer configuration as shown in FIG. 3. For example, each of the coupling layers 51 and 55 may be composed of nonmagnetic conductive layers of any plural number other than three and a magnetic layer disposed between every adjacent two of the nonmagnetic conductive layers, or may be composed of a single nonmagnetic conductive layer only.

It is preferable that each of the first and second coupling layers 51 and 55 be composed of three or a greater odd number of nonmagnetic conductive layers and an even number of magnetic layers, the magnetic layers being respectively disposed between every adjacent two of the nonmagnetic conductive layers. The reason is that such a configuration allows cancellation of magnetic moments of the magnetic layers in each of the coupling layers 51 and 55 and thereby reduces the responsiveness of the coupling layers 51 and 55 to an external magnetic field.

Reference is now made to FIG. 2 to describe the location of the bias magnetic field applying layer 6 of the present embodiment in detail. As shown in FIG. 2, the bias magnetic field applying layer 6 is disposed between the first read shield portion 3 and the second read shield portion 8 so as to be adjacent to the MR stack 5 in the Y direction, i.e., the direction orthogonal to the direction in which the layers constituting the MR stack 5 are stacked.

The first magnetization controlling layer 75 has a top surface 75a and a bottom surface 75b. The top surface 75a includes a first portion 75a1 touching the MR stack 5, and a second portion 75a2 that is located closer to the bottom surface 75b than is the first portion 75a1 so that a recess 79 is formed below the bias magnetic field applying layer 6. The insulating film 4 is disposed on the second portion 75a2, and the bias magnetic field applying layer 6 is disposed on the insulating film 4.

In the present embodiment, the first magnetization controlling layer 75 includes the first ferromagnetic layer 76, the nonmagnetic middle layer 77 and the third ferromagnetic layer 78. The third ferromagnetic layer 78 has a top surface 78a that forms the top surface 75a of the first magnetization controlling layer 75, and a bottom surface 78b touching the nonmagnetic middle layer 77. The recess 79 is formed in the top surface 78a of the third ferromagnetic layer 78. The recess 79 has a depth D2. It is preferred that the depth D2 be equal to or smaller than one-half of the distance D1 between the first portion 75a1 of the top surface 75a of the first magnetization controlling layer 75 and the bottom surface 78b of the third ferromagnetic layer 78. The reason will be described in detail later.

The bias magnetic field applying layer 6 applies a bias magnetic field to the free layers 52 and 54 so that the magnetizations of the free layers 52 and 54 change their directions compared with a state in which no bias magnetic field is applied to the free layers 52 and 54. The bias magnetic field applying layer 6 preferably applies a bias magnetic field to the free layers 52 and 54 so that the magnetizations of the free layers 52 and 54 are directed orthogonal to each other.

The MR element of the present embodiment is of the CPP structure. More specifically, a sense current, which is a current used for detecting a signal magnetic field, is fed in a direction intersecting the planes of the layers constituting the MR stack 5, such as the direction perpendicular to the planes of the layers constituting the MR stack 5. The first read shield portion 3 and the second read shield portion 8 also function as a pair of electrodes for feeding the sense current to the MR stack 5 in a direction intersecting the planes of the layers constituting the MR stack 5, such as the direction perpendicular to the planes of the layers constituting the MR stack 5.

An example of specific configuration of the MR element of the present embodiment will now be described. The MR element having this configuration will be hereinafter called an MR element of Example. In the following description, thickness of each layer is a dimension taken in the direction of stacking of a plurality of layers in a portion where the layers are stacked.

Table 1 shows the configurations of the first exchange coupling shield layer 72, the MR stack 5 and the second exchange coupling shield layer 82 of the MR element of Example. In the Example, each of the first and second main shield layers 71 and 81 is composed of an NiFe layer. Each of the first and second main shield layers 71 and 81 has a thickness within a range of 1 to 2 μm, for example. In the Example, each of the first free layer 52 and the second free layer 54 is composed of a stack of three magnetic layers: a CoFe layer, a CoFeB layer and a CoFe layer. In the Example, since the spacer layer 53 is made of MgO, the spacer layer 53 is a tunnel barrier layer and the MR stack 5 is a TMR element. The dimension of the MR stack 5 taken in the track width direction is 50 nm, and the dimension of the MR stack 5 taken in the direction perpendicular to the medium facing surface 40 is 60 nm. In the Example, the first ferromagnetic layer 76, the second ferromagnetic layer 86 and the third ferromagnetic layer 78 are each composed of a stack of three magnetic layers: a CoFe layer, an NiFe layer and a CoFe layer. Each of the CoFe layers in the ferromagnetic layers 76, 86 and 78 contains, for example, approximately 70 atomic % of Co and a balance of Fe. The underlayer 73 is composed of a stack of two nonmagnetic conductive layers: a Ta layer and a Ru layer.

TABLE 1

| Configuration of Example | | | Material | Thickness (nm) |
|---|---|---|---|---|
| Nonmagnetic cap layer 83 | | | NiCr | 2 |
| 2nd antiferromagnetic layer 84 | | | IrMn | 7 |
| 2nd magnetization controlling layer 85 | 2nd ferromagnetic layer 86 | Magnetic layer | CoFe | 1 |
| | | Magnetic layer | NiFe | 12 |
| | | Magnetic layer | CoFe | 1 |
| MR stack 5 | 2nd coupling layer 55 | Nonmagnetic conductive layer 55e | Ru | 0.8 |
| | | Magnetic layer 55d | CoFe | 1 |
| | | Nonmagnetic conductive layer 55c | Ru | 0.8 |
| | | Magnetic layer 55b | CoFe | 1 |
| | | Nonmagnetic conductive layer 55a | Ru | 0.8 |
| | 2nd free layer 54 | Magnetic layer | CoFe | 1.5 |
| | | Magnetic layer | CoFeB | 2 |
| | | Magnetic layer | CoFe | 1.5 |
| | Spacer layer 53 | | MgO | 1 |
| | 1st free layer 52 | Magnetic layer | CoFe | 1.5 |
| | | Magnetic layer | CoFeB | 2 |
| | | Magnetic layer | CoFe | 1.5 |

TABLE 1-continued

| Configuration of Example | | | Material | Thickness (nm) |
|---|---|---|---|---|
| | 1st coupling layer 51 | Nonmagnetic conductive layer 51e | Ru | 0.8 |
| | | Magnetic layer 51d | CoFe | 1 |
| | | Nonmagnetic conductive layer 51c | Ru | 0.8 |
| | | Magnetic layer 51b | CoFe | 1 |
| | | Nonmagnetic conductive layer 51a | Ru | 0.8 |
| 1st magnetization controlling layer 75 | 3rd ferromagnetic layer 78 | Magnetic layer | CoFe | 1 |
| | | Magnetic layer | NiFe | 15 |
| | | Magnetic layer | CoFe | 1 |
| | Nonmagnetic middle layer 77 | | Ru | 0.8 |
| | 1st ferromagnetic layer 76 | Magnetic layer | CoFe | 1 |
| | | Magnetic layer | NiFe | 12 |
| | | Magnetic layer | CoFe | 1 |
| 1st antiferromagnetic layer 74 | | | IrMn | 7 |
| Underlayer 73 | | Nonmag. conductive layer | Ru | 2 |
| | | Nonmag. conductive layer | Ta | 1 |

The read gap length in the Example is 19.8 nm. The insulating film 4 is formed of an alumina layer having a thickness of 5 nm. The bias magnetic field applying layer 6 is composed of a stack of a 3-nm-thick Cr layer and a 30-nm-thick CoPt layer, wherein the CoPt layer is a hard magnetic layer and the Cr layer is an underlayer for the CoPt layer. The protection layer 61 is formed of a Cr layer having a thickness of 10 nm.

In the Example, the depth D2 of the recess 79 was set to 6 nm. The distance D1 between the first portion 75a1 of the top surface 75a of the first magnetization controlling layer 75 and the bottom surface 78b of the third ferromagnetic layer 78 is equal to the thickness of the third ferromagnetic layer 78, i.e., 17 nm. The depth D2 of the recess 79 thus satisfies the requirement that the depth D2 be equal to or smaller than one-half of the distance D1.

A manufacturing method for the MR element of the present embodiment will now be described. In this manufacturing method, first, the first main shield layer 71 having a predetermined pattern is formed on the insulating layer 2 by, for example, frame plating. Next, the layers constituting the first exchange coupling shield layer 72 are formed one by one on the first main shield layer 71 by, for example, sputtering. Next, a plurality of films to later become the layers constituting the MR stack 5 are formed one by one on the first exchange coupling shield layer 72 by, for example, sputtering, whereby a multilayer film for the MR stack 5 is formed.

Next, the multilayer film for the MR stack 5 is selectively etched to thereby form the MR stack 5. At this time, the recess 79 is formed by etching a portion of the third ferromagnetic layer 78 located in the region in which the bias magnetic field applying layer 6 is to be formed later. Next, the insulating film 4 is formed by, for example, sputtering.

Next, the two nonmagnetic metal layers 90 are formed on the insulating film 4 by, for example, sputtering, such that the nonmagnetic metal layers 90 are respectively adjacent to the two side surfaces of the MR stack 5 with the insulating film 4 located between the MR stack 5 and the nonmagnetic metal layers 90. Next, the bias magnetic field applying layer 6 is formed on the insulating film 4 such that the bias magnetic field applying layer 6 is adjacent to the rear end face of the MR stack 5 with the insulating film 4 located between the MR stack 5 and the bias magnetic field applying layer 6, and the protection layer 61 is formed on the bias magnetic field applying layer 6. The bias magnetic field applying layer 6 and the protection layer 61 are both formed by, for example, sputtering. The bias magnetic field applying layer 6 is disposed over the recess 9 with the insulating film 4 in between. Next, the insulating refill layer 7 is formed by, for example, sputtering.

Next, the layers constituting the second exchange coupling shield layer 82 are formed by, for example, sputtering, one by one. Next, the second main shield layer 81 having a predetermined pattern is formed by, for example, frame plating.

The directions of the magnetizations of the first and second ferromagnetic layers 76, 86 and the direction of the magnetization of the bias magnetic field applying layer 6 are set by separate magnetizing processes including annealing at different temperatures. The magnetizations of the first and second ferromagnetic layers 76, 86 and the magnetization of the bias magnetic field applying layer 6 can be set to different directions since the appropriate annealing temperatures in the magnetizing processes therefor are different.

According to the present embodiment, after forming the underlayer 73 of a nonmagnetic conductive material on the first main shield layer 71, the first antiferromagnetic layer 74 is formed on the underlayer 73. If the first antiferromagnetic layer 74 is formed directly on the first main shield layer 71, which is a magnetic layer, the crystallinity and orientability of the first antiferromagnetic layer 74 will suffer degradation due to a crystal lattice mismatch between the first main shield layer 71 and the first antiferromagnetic layer 74, and this results in a decrease in exchange coupling magnetic field produced between the first antiferromagnetic layer 74 and the first ferromagnetic layer 76. In contrast, according to the present embodiment, the underlayer 73 is formed on the first main shield layer 71 and then the first antiferromagnetic layer 74 is formed on the underlayer 73. This improves the crystallinity and orientability of the first antiferromagnetic layer 74, and as a result, it is possible to increase the exchange coupling magnetic field produced between the first antiferromagnetic layer 74 and the first ferromagnetic layer 76. Furthermore, it is thereby possible to increase the exchange coupling magnetic field produced between the first ferromagnetic layer 76 and the third ferromagnetic layer 78. This will be described in detail later with reference to experimental results.

The underlayer 73 is preferably made of a material that can reduce the crystal lattice mismatch between first main shield layer 71 and the first antiferromagnetic layer 74. From this viewpoint, the underlayer 73 preferably contains at least one of Ta and Ru.

The underlayer 73 also has the function of magnetically separating the first main shield layer 71 and the first antiferromagnetic layer 74 from each other so as to prevent transmission of the magnetic behavior of the first main shield layer 71 to the first antiferromagnetic layer 74. This function serves to magnetically stabilize the first antiferromagnetic layer 74 and thereby suppresses variations in the magnetization direction of the first ferromagnetic layer 76. This eventually suppresses variations in the magnetization direction of the first free layer 52.

Similarly, the nonmagnetic cap layer 83 has the function of magnetically separating the second main shield layer 81 and the second antiferromagnetic layer 84 from each other so as to prevent transmission of the magnetic behavior of the second main shield layer 81 to the second antiferromagnetic layer 84. This function serves to magnetically stabilize the second antiferromagnetic layer 84 and thereby suppresses variations in the magnetization direction of the second ferromagnetic layer 86. This eventually suppresses variations in the magnetization direction of the second free layer 54.

Figure 6:
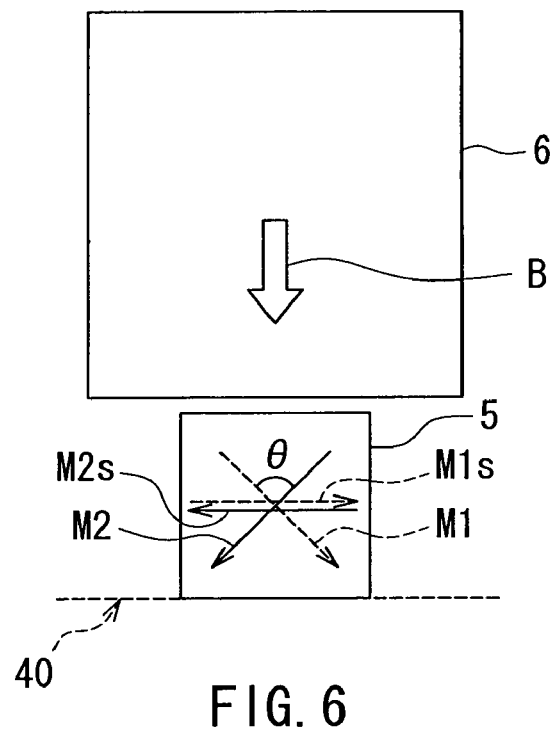
FIG. 6 is an illustrative view for explaining the operation of the magnetoresistive element of the first embodiment of the invention.
Figure 7:
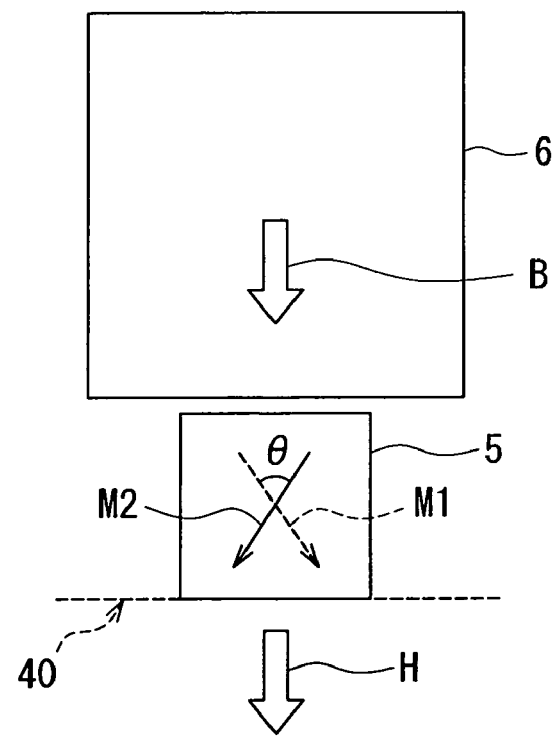
FIG. 7 is an illustrative view for explaining the operation of the magnetoresistive element of the first embodiment of the invention.
Figure 8:
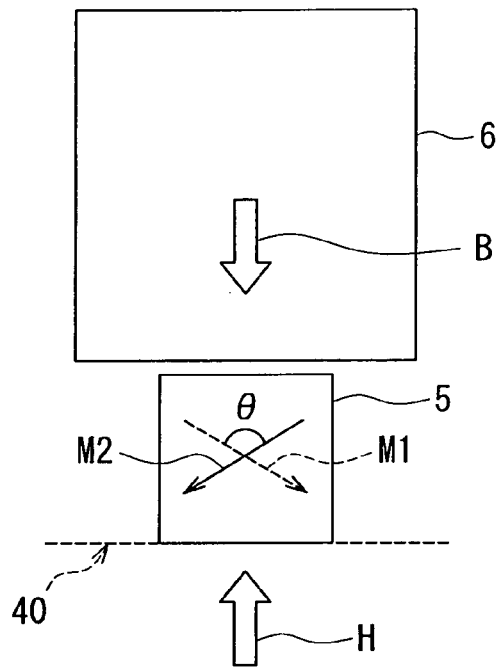
FIG. 8 is an illustrative view for explaining the operation of the magnetoresistive element of the first embodiment of the invention.

The operation of the MR element of the present embodiment will now be described with reference to FIG. 6 to FIG. 8. Each of FIG. 6 to FIG. 8 shows the MR stack 5 and the bias magnetic field applying layer 6. In FIG. 6 to FIG. 8 the arrow marked with "B" indicates a bias magnetic field generated by the bias magnetic field applying layer 6. The arrow marked with "M1s" indicates the direction of the magnetization of the first free layer 52 when any external magnetic field (including a bias magnetic field) other than a magnetic field resulting from the first and second magnetization controlling layers 75 and 85 is not applied to the first free layer 52. The arrow marked with "M2s" indicates the direction of the magnetization of the second free layer 54 when any external magnetic field described above is not applied to the second free layer 54. The arrow marked with "M1s" indicates the direction of the magnetization of the first free layer 52 when the bias magnetic field B is applied to the first free layer 52. The arrow marked with "M2" indicates the direction of the magnetization of the second free layer 54 when the bias magnetic field B is applied to the second free layer 54.

As shown in FIG. 6, when no external magnetic field is applied to the free layers 52 and 54, the directions of the magnetizations of the free layers 52 and 54 are antiparallel to each other. When the bias magnetic field B is applied but no signal magnetic field is applied to the free layers 52 and 54, the directions of the magnetizations of the free layers 52 and 54 become non-antiparallel to each other. When in this state, it is desirable that the direction of the magnetization of the first free layer 52 and the direction of the magnetization of the second free layer 54 each form an angle of 45 degrees with respect to the medium facing surface 40 and the relative angle θ between the directions of the magnetizations of the free layers 52 and 54 be 90 degrees.

FIG. 7 shows a state in which the bias magnetic field B and also a signal magnetic field H in the same direction as the bias magnetic field B are applied to the free layers 52 and 54. When in this state, the angle formed by the direction of the magnetization of the first free layer 52 with respect to the medium facing surface 40 and the angle formed by the direction of the magnetization of the second free layer 54 with respect to the medium facing surface 40 are each greater compared with the state shown in FIG. 6. As a result, the relative angle θ between the directions of the magnetizations of the free layers 52 and 54 is smaller compared with the state shown in FIG. 6.

FIG. 8 shows a state in which the bias magnetic field B and also a signal magnetic field H in a direction opposite to the direction of the bias magnetic field B are applied to the free layers 52 and 54. When in this state, the angle formed by the direction of the magnetization of the first free layer 52 with respect to the medium facing surface 40 and the angle formed by the direction of the magnetization of the second free layer 54 with respect to the medium facing surface 40 are each smaller compared with the state shown in FIG. 6. As a result, the relative angle θ between the directions of the magnetizations of the free layers 52 and 54 is greater compared with the state shown in FIG. 6.

The relative angle between the directions of the magnetizations of the free layers 52 and 54 thus changes in response to a signal magnetic field, and as a result, the resistance of the MR stack 5 changes. It is therefore possible to detect the signal magnetic field by detecting the resistance of the MR stack 5. The resistance of the MR stack 5 can be determined from the potential difference produced in the MR stack 5 when a sense current is fed to the MR stack 5. It is thus possible, through the use of the MR element, to read data stored on the recording medium.

The effects of the MR element of the present embodiment will now be described. According to the present embodiment, in the first exchange coupling shield layer 72, the first ferromagnetic layer 76 is exchange-coupled to the first antiferromagnetic layer 74 and the third ferromagnetic layer 78 is antiferromagnetically exchange-coupled to the first ferromagnetic layer 76 through the nonmagnetic middle layer 77, whereby the direction of the magnetization of the third ferromagnetic layer 78 is set. On the other hand, in the second exchange coupling shield layer 82, the second ferromagnetic layer 86 is exchange-coupled to the second antiferromagnetic layer 84, whereby the direction of the magnetization of the second ferromagnetic layer 86 is set. As a result, the directions of the magnetizations of the second ferromagnetic layer 86 and the third ferromagnetic layer 78 become antiparallel to each other. The first free layer 52 is magnetically coupled to the third ferromagnetic layer 78, and the second free layer 54 is magnetically coupled to the second ferromagnetic layer 86. As a result, the magnetizations of the two free layers 52 and 54 are directed antiparallel to each other when any external magnetic field other than a magnetic field resulting from the first and second magnetization controlling layers 75 and 85 is not applied to the two free layers 52 and 54. According to the present embodiment, it is thus possible to direct the magnetizations of the two free layers 52 and 54 antiparallel to each other when no external magnetic field is applied, without making use of antiferromagnetic coupling between the two free layers through the spacer layer 53. Consequently, according to the present embodiment, no limitation is imposed on the material and thickness of the spacer layer 53, in contrast to the case of making use of antiferromagnetic coupling between the two free layers.

Furthermore, the present embodiment allows a reduction in read gap length because no antiferromagnetic layer is present between the MR stack 5 and each of the third ferromagnetic layer 78 and the second ferromagnetic layer 86 that each function as a shield. According to the configuration shown in Table 1, the read gap length is 19.8 nm. This is much smaller than the read gap length of a typical spin-valve MR element, which is approximately 30 nm.

Furthermore, the present embodiment makes it possible that the direction of the magnetization of the third ferromagnetic layer 78 and the direction of the magnetization of the second ferromagnetic layer 86, which respectively determine the direction of the magnetization of the first free layer 52 and the direction of the magnetization of the second free layer 54, are antiparallel to each other. Consequently, according to the present embodiment, it is possible to configure each of the first and second coupling layers 51 and 55 to cancel the magnetic moments of the magnetic layers in each of the coupling layers 51 and 55. This reduces the responsiveness of the coupling layers 51 and 55 to an external magnetic field, and thereby stabilizes the operation of the MR element.

According to the present embodiment, the top surface 75a of the first magnetization controlling layer 75 is provided with the recess 79 located below the bias magnetic field applying layer 6, and the bias magnetic field applying layer 6 is disposed over the recess 79 with the insulating film 4 in between. If the recess 79 is not formed in the top surface 75a of the first magnetization controlling layer 75 and the bias magnetic field applying layer 6 is disposed over the top surface 75a with the insulating film 4 in between, the bottom surface of the hard magnetic layer in the bias magnetic field applying layer 6 will be located at a level higher than the bottom surface of the MR stack 5 by the total thickness of the insulating film 4 and the underlayer in the bias magnetic field applying layer 6. As a result, the central position of the hard magnetic layer of the bias magnetic field applying layer 6 taken in the thickness direction will be much higher than the central position of the spacer layer 53 of the MR stack 5 taken in the thickness direction. In this case, it becomes impossible to apply a sufficient bias magnetic field from the bias magnetic field applying layer 6 to the free layer 52, which is located at a lower level than the free layer 54. This causes the relative angle between the directions of the magnetizations of the free layers 52 and 54 to deviate from 90 degrees, and as a result, the asymmetry of the read output waveform deviates from zero.

In contrast, according to the present embodiment, the recess 79 is formed in the top surface 75a of the first magnetization controlling layer 75 and the bias magnetic field applying layer 6 is disposed over the recess 79 with the insulating film 4 in between, as described above. This allows the central position of the hard magnetic layer of the bias magnetic field applying layer 6 taken in the thickness direction to be closer to the central position of the spacer layer 53 of the MR stack 5 taken in the thickness direction, compared with the case without the recess 79. Thus, the present embodiment allows a sufficient bias magnetic field to be applied from the bias magnetic field applying layer 6 to the free layers 52 and 54, and thereby allows the relative angle between the directions of the magnetizations of the free layers 52 and 54 to be 90 degrees. As a result, it is possible to achieve a zero asymmetry of the read output waveform.

Forming the recess 79 in the top surface 75a of the first magnetization controlling layer 75 reduces the thickness of the third ferromagnetic layer 78 at the area where the recess 79 is formed. If the thickness of the third ferromagnetic layer 78 is reduced too much at the area where the recess 79 is formed, the third ferromagnetic layer 78 will become effectively long in the track width direction, and will thereby have a magnetic shape anisotropy that orients the easy axis of magnetization to the track width direction. This reduces the responsiveness of the third ferromagnetic layer 78 to an external magnetic field, and thereby impairs the function of the third ferromagnetic layer 78 as a shield.

According to the present embodiment, the first exchange coupling shield layer 72 includes the underlayer 73, and this serves to avoid the above-described problem associated with the formation of the recess 79. The reason will now be described. According to the present embodiment, the under layer 73 made of a nonmagnetic conductive material is disposed on the first main shield layer 71, and the first antiferromagnetic layer 74 is disposed on the underlayer 73. This allows an increase in the exchange coupling magnetic field produced between the first antiferromagnetic layer 74 and the first ferromagnetic layer 76, and also an increase in the exchange coupling magnetic field produced between the first ferromagnetic layer 76 and the third ferromagnetic layer 78. Typically, an exchange coupling magnetic field produced between an antiferromagnetic layer and a ferromagnetic layer, or between two ferromagnetic layers with a nonmagnetic middle layer in between, decreases with an increase in ferromagnetic layer thickness. According to the present embodiment, providing the underlayer 73 makes it possible to increase the exchange coupling magnetic field acting on the third ferromagnetic layer 78, compared with the case without the underlayer 73. Therefore, if comparison is made for the same value of exchange coupling magnetic field acting on the third ferromagnetic layer 78, the present embodiment allows the third ferromagnetic layer 78 to be greater in thickness than in the case without the underlayer 73. Consequently, according to the present embodiment, even if the recess 79 is formed in the top surface 75a of the first magnetization controlling layer 75, i.e., the top surface 78a of the third ferromagnetic layer 78, it is possible to prevent the thickness of the third ferromagnetic layer 78 from being reduced too much at the area where the recess 79 is formed. As a result, it is possible for the third ferromagnetic layer 78 to fully perform its function as a shield.

The effects of the MR element of the present embodiment will now be described in detail with reference to the results of first to third experiments.

[First Experiment]

Figure 9:
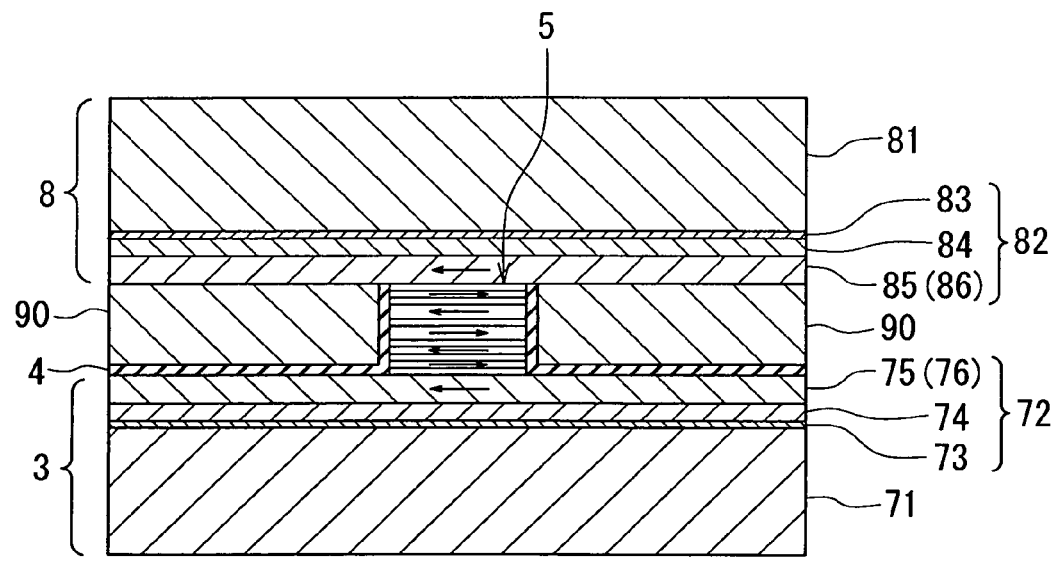
FIG. 9 is a cross-sectional view showing a cross section of a magnetoresistive element of First Comparative Example parallel to the medium facing surface.

In the first experiment, an MR element of Example having the configuration shown in FIG. 1 and Table 1 and an MR element of First Comparative Example having the configuration shown in FIG. 9 and Table 2 were prepared and their electromagnetic transducing characteristics were compared. In the MR element of Example, the first magnetization controlling layer 75 includes the first ferromagnetic layer 76, the nonmagnetic middle layer 77 and the third ferromagnetic layer 78. In contrast, in the MR element of First Comparative Example, as shown in Table 9, the first magnetization controlling layer 75 includes only the first ferromagnetic layer 76 that is exchange-coupled to the first antiferromagnetic layer 74. In the MR element of First Comparative Example, the nonmagnetic conductive layer 51a of the first coupling layer 51 touches the first ferromagnetic layer 76.

In the MR element of Example, the second coupling layer 55 of the MR stack 5 is composed of five layers: the nonmagnetic conductive layer 55a, the magnetic layer 55b, the nonmagnetic conductive layer 55c, the magnetic layer 55d and the nonmagnetic conductive layer 55e. In contrast, in the MR element of First Comparative Example, the second coupling layer 55 of the MR stack 5 is composed of three layers: the nonmagnetic conductive layer 55a, the magnetic layer 55b and the nonmagnetic conductive layer 55c. Thus, according to the First Comparative Example, the structure of the second coupling layer 55 is not vertically symmetrical with the structure of the first coupling layer 51. This is because, in the First Comparative Example, the magnetization of the first ferromagnetic layer 76 touching the first coupling layer 51 and the magnetization of the second ferromagnetic layer 86 touching the second coupling layer 55 are in the same direction. The remainder of configuration of the MR element of First Comparative Example is the same as that of the MR element of Example. Table 2 shows the specific configurations of the first exchange coupling shield layer 72, the MR stack 5 and the second exchange coupling shield layer 82 of the MR element of First Comparative Example.

TABLE 2

| Configuration of 1st Comparative Example | | | Material | Thickness (nm) |
|---|---|---|---|---|
| Nonmagnetic cap layer 83 | | | NiCr | 2 |
| 2nd antiferromagnetic layer 84 | | | IrMn | 7 |
| 2nd magnetization controlling layer 85 | 2nd ferromagnetic layer 86 | Magnetic layer | CoFe | 1 |
| | | Magnetic layer | NiFe | 12 |
| | | Magnetic layer | CoFe | 1 |
| MR stack 5 | 2nd coupling layer 55 | Nonmagnetic conductive layer 55c | Ru | 0.8 |
| | | Magnetic layer 55b | CoFe | 1 |
| | | Nonmagnetic conductive layer 55a | Ru | 0.8 |
| | 2nd free layer 54 | Magnetic layer | CoFe | 1.5 |
| | | Magnetic layer | CoFeB | 2 |
| | | Magnetic layer | CoFe | 1.5 |
| | Spacer layer 53 | | MgO | 1 |
| | 1st free layer 52 | Magnetic layer | CoFe | 1.5 |
| | | Magnetic layer | CoFeB | 2 |
| | | Magnetic layer | CoFe | 1.5 |
| | 1st coupling layer 51 | Nonmagnetic conductive layer 51e | Ru | 0.8 |
| | | Magnetic layer 51d | CoFe | 1 |
| | | Nonmagnetic conductive layer 51c | Ru | 0.8 |
| | | Magnetic layer 51b | CoFe | 1 |
| | | Nonmagnetic conductive layer 51a | Ru | 0.8 |
| 1st magnetization controlling layer 75 | 1st ferromagnetic layer 76 | Magnetic layer | CoFe | 1 |
| | | Magnetic layer | NiFe | 15 |
| | | Magnetic layer | CoFe | 1 |
| 1st antiferromagnetic layer 74 | | | IrMn | 7 |
| Underlayer 73 | | Nonmagnetic conductive layer | Ru | 2 |
| | | Nonmagnetic conductive layer | Ta | 1 |

In the first experiment, electromagnetic transducing characteristics were evaluated for each of the MR element of Example and the MR element of First Comparative Example. Electromagnetic transducing characteristics are characteristics of an MR element exhibited when the MR element detects a signal magnetic field sent from a recording medium while a thin-film magnetic head including the MR element is made to fly over the surface of the recording medium through the use of a head gimbal assembly described later. One of the electromagnetic transducing characteristics is read output. Here, the waveform of an output voltage of an MR element obtained when a signal magnetic field having any amplitude and changing polarity from positive to negative and vice versa is applied to the MR element is referred to as a read output waveform, and the read output is defined as the difference between the maximum value and the minimum value, or the peak-to-peak value, of an isolated waveform of the read output waveform. The MR elements of Example and First Comparative Example both had a maximum read output of 15 mV. Therefore, the MR elements of Example and First Comparative Example are equivalent in terms of read output.

In the first experiment, resolution was also evaluated for each of the MR element of Example and the MR element of First Comparative Example. Resolution is a parameter indicating the frequency dependence of the read output. In the first experiment, the resolution was defined as the read output when writing was performed with an isolated waveform divided by the read output when writing was performed at a frequency of 190 MHz, and was determined. As a result, the MR elements of Example and First Comparative Example showed equivalent resolutions.

Figure 10:
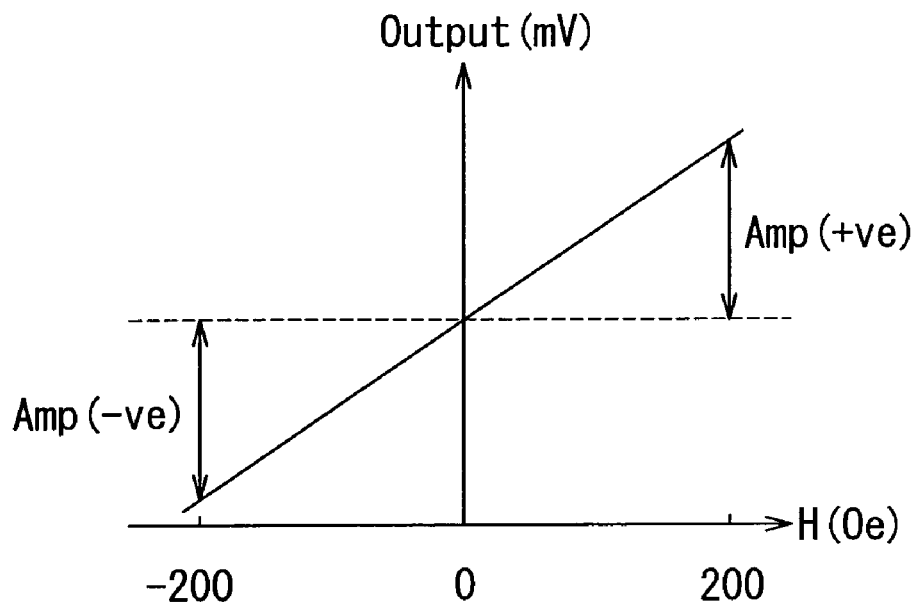
FIG. 10 is an illustrative view for explaining asymmetry of a read output waveform of a magnetoresistive element.

In the first experiment, asymmetry of the read output waveform was also measured for each of the MR element of Example and the MR element of First Comparative Example. Asymmetry of the read output waveform refers to asymmetry of two portions of the read output waveform of an MR element when a signal magnetic field having any amplitude and changing polarity from positive to negative and vice versa is applied to the MR element, the two portions corresponding to the positive and negative polarities of the signal magnetic field. Reference is now made to FIG. 10 to describe the method of measurement of the asymmetry of the read output waveform of the MR element employed in the first experiment. In FIG. 10 the horizontal axis represents the applied magnetic field H to the MR element, and the vertical axis represents the output voltage of the MR element. In the first experiment, as shown in FIG. 10, the difference (absolute value) between the output voltage of the MR element when the applied magnetic field was +200 Oe (1 Oe=79.6 A/m) and the output voltage of the MR element when the applied magnetic field was zero was defined as Amp(+ve). In addition, the difference (absolute value) between the output voltage of the MR element when the applied magnetic field was −200 Oe and the output voltage of the MR element when the applied magnetic field was zero was defined as Amp(−ve). Then, the asymmetry of the read output waveform of the MR element was defined by the following expression.

$$\{Amp(+ve)-Amp(-ve)\}/\{Amp(+ve)+Amp(-ve)\}$$

In the first experiment, the read output obtained when applying a signal magnetic field having an amplitude of 200 Oe and changing polarity from positive to negative and vice versa, and the standard deviation of the asymmetry, which represents variations in asymmetry, were also determined for each of the MR elements of Example and First Comparative Example. As a result, the standard deviation of the asymmetry was 10% for the MR element of Example, and 14% for the MR element of First Comparative Example. This shows that the MR element of Example is capable of reducing variations in asymmetry while being equivalent in read output and resolution, as compared with the MR element of First Comparative Example. The reason why the MR element of Example reduces variations in asymmetry compared the MR element of First Comparative Example is presumably as follows. According to the First Comparative Example, it is not possible to cancel the magnetic moment of the magnetic layer 55b of the second coupling layer 55 of the MR stack 5, and this presumably makes the second coupling layer 55 tend to become unstable against an external magnetic field. In contrast, according to the Example, it is possible to cancel the magnetic moments of the magnetic layers in each of the coupling layers 51 and 55 of the MR stack 5, and this presumably allows the coupling layers 51 and 55 to be stable against an external magnetic field.

The results of the first experiment indicate that the present embodiment allows a reduction in variations in asymmetry because of the feature that the second magnetization controlling layer 85 includes only the second ferromagnetic layer 86 while the first magnetization controlling layer 75 includes the first ferromagnetic layer 76, the nonmagnetic middle layer 77 and the third ferromagnetic layer 78.

[Second Experiment]

The second experiment will now be described. In the second experiment, first, the relationship between the thickness of the third ferromagnetic layer 78 and the exchange coupling magnetic filed acting on the third ferromagnetic layer 78 in the case without the underlayer 73 was studied. The exchange coupling magnetic field was measured using a plurality of samples formed as follows. Each sample was formed by stacking the first antiferromagnetic layer 74, the first ferromagnetic layer 76, the nonmagnetic middle layer 77 and the third ferromagnetic layer 78 in this order on the first main shield layer 71, and further stacking a spacer layer and a free layer in this order on the third ferromagnetic layer 78. The configurations of the layers 74, 76, 77 and 78 are as shown in Table 1. The spacer layer is made of Cu, and the free layer is a layered film composed of a CoFe layer and an NiFe layer. The thickness of the third ferromagnetic layer 78 varies among the samples. The thickness of the third ferromagnetic layer 78 was varied by varying the thickness of the NiFe layer sandwiched between the two CoFe layers each having a thickness of 1 nm.

The exchange coupling magnetic field was measured as follows. First, each sample was measured for sheet resistance R while applying a changing magnetic field H to each sample, and a hysteresis loop indicating the relationship between the magnetic field H and the sheet resistance R of the sample was formed. The magnetic field H is in the direction the same as or opposite to the magnetization direction of the third ferromagnetic layer 78 set by exchange coupling. Here, the magnetic field H is expressed as a negative value when the direction of the magnetic field H is the same as the magnetization direction of the third ferromagnetic layer 78 set by exchange coupling, and expressed as a positive value when the direction of the magnetic field H is opposite to the magnetization direction of the third ferromagnetic layer 78 set by exchange coupling. In the second experiment, starting from a magnetic field H of a certain negative value (e.g., −1000 Oe) applied to the sample, the applied magnetic field H was gradually increased to a certain positive value, and then gradually decreased to the certain negative value. The sheet resistance R was measured by a four point probe method. Here, let Rs be the sheet resistance R of the sample when a magnetic field H of a certain negative value (e.g., −1000 Oe) is applied to the sample, and $\Delta$Rs be the sheet resistance R of the sample when a magnetic field H of any value is applied to the sample minus Rs. Defining $\Delta$Rs/Rs×100(%) as an MR value, a hysteresis loop indicating the relationship between the magnetic field H and the MR value was formed. This hysteresis loop is shown in FIG. 11.

Figure 11:
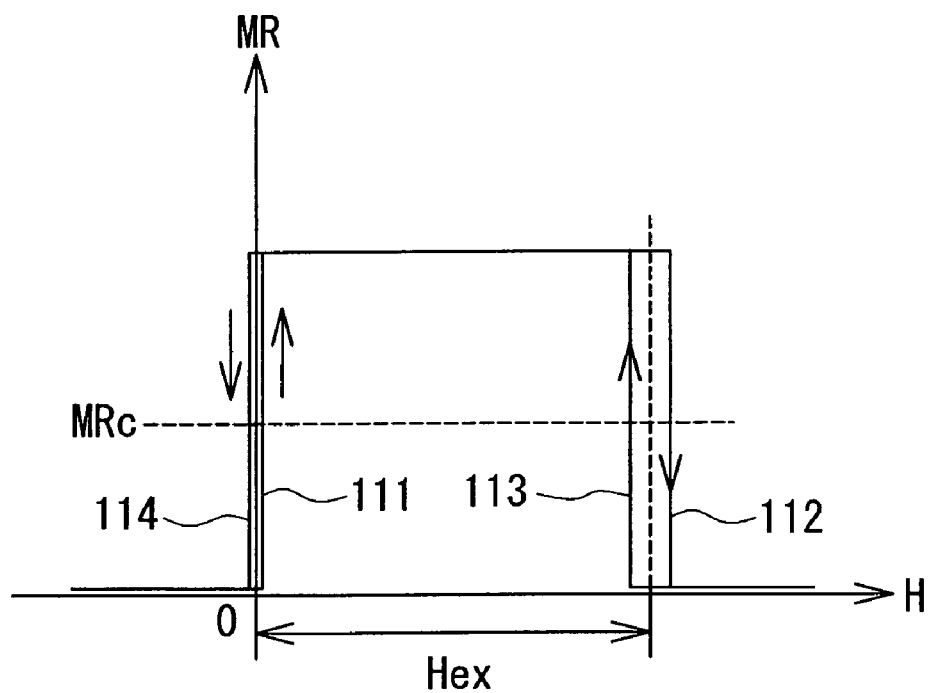
FIG. 11 is an illustrative view for explaining the method of measuring an exchange coupling magnetic field.

As shown in FIG. 11, when a magnetic field H of a certain negative value is applied to the sample, the MR value is minimum because the magnetization direction of the free layer is the same as that of the third ferromagnetic layer 78. As the magnetic field H is gradually increased from the certain negative value up to a positive value, at the portion 111 the magnetization direction of the free layer changes to become opposite to that of the pinned layer, and as a result, the MR value increases to reach the maximum. As the magnetic field H is further increased, at the portion 112 the magnetization direction of the third magnetic layer 78 changes to become the same as that of the free layer, and as a result, the MR value decreases to the minimum. As the magnetic field H is gradually decreased after being increased up to the certain positive value, at the portion 113 the magnetization direction of the third ferromagnetic layer 78 changes back to the initial direction set by exchange coupling, and as a result, the MR value increases to the maximum. As the magnetic field H is further gradually decreased to a negative value, at the portion 114 the magnetization direction of the free layer changes to become the same as that of the third ferromagnetic layer 78, and as a result, the MR value decreases to the minimum.

Here, let MRc be the maximum MR value minus 50% of the difference between the maximum MR value and the minimum MR value in the hysteresis loop of FIG. 11. Let Ha be the magnitude of the magnetic field H when the MR value becomes equal to MRc at the portion 113 of the hysteresis loop of FIG. 11. Let Hb be the magnitude of the magnetic field H when the MR value becomes equal to MRc at the portion 112 of the hysteresis loop of FIG. 11. The exchange coupling magnetic field Hex was determined by the following equation.

$$Hex = Ha + |Hb - Ha|/2$$

The exchange coupling magnetic field Hex serves as an indicator that indicates how firmly the magnetization of the third ferromagnetic layer 78 is fixed. If the exchange coupling magnetic field Hex is small in the third ferromagnetic layer 78, the third ferromagnetic layer 78 is good in responsiveness to an external magnetic field, and consequently, it can be said that the third ferromagnetic layer 78 has a high ability to absorb an unwanted magnetic flux as a shield. In this case, however, it can be said that the third ferromagnetic layer 78 has a low ability to control the magnetization of the first free layer 52. On the other hand, if the exchange coupling magnetic field Hex is large, the ability of the third ferromagnetic layer 78 to control the magnetization of the first free layer 52 is high, although its ability as a shield is low.

In the second experiment, the relationship between the thickness of the third ferromagnetic layer 78 and the exchange coupling magnetic field acting on the third ferromagnetic layer 78 in the case without the underlayer 73 was determined by measuring the exchange coupling magnetic field Hex in the above-described manner for each of the plurality of samples different in thickness of the third ferromagnetic layer 78.

In addition, in the second experiment, the relationship between the thickness of the third ferromagnetic layer 78 and the exchange coupling magnetic field acting on the third ferromagnetic layer 78 in the case of having the underlayer 73 was determined in the same manner as above.

In addition, in the second experiment, the relationship between the thickness of the second ferromagnetic layer 86 and the exchange coupling magnetic field acting on the second ferromagnetic layer 86 was determined with a plurality of samples. Each of the plurality of samples used was formed by stacking the second antiferromagnetic layer 84 and the second ferromagnetic layer 86 in this order on the second main shield layer 81, and further stacking a spacer layer and a free layer in this order on the second ferromagnetic layer 86. The configurations of the layers 84 and 86 are as shown in Table 1. The spacer layer is made of Cu, and the free layer is a layered film composed of a CoFe layer and an NiFe layer. The thickness of the second ferromagnetic layer 86 varies among the samples. The thickness of the second ferromagnetic layer 86 was varied by varying the thickness of the NiFe layer sandwiched between the two CoFe layers each having a thickness of 1 nm.

Figure 12:
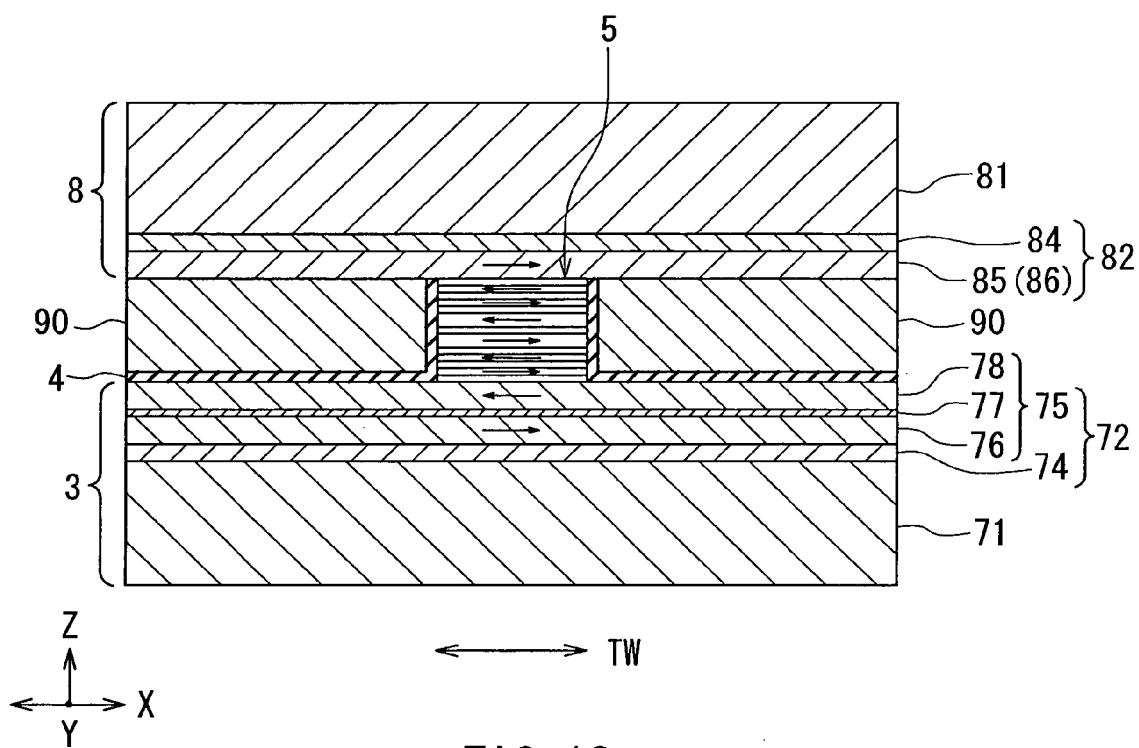
FIG. 12 is a cross-sectional view showing a cross section of a magnetoresistive element of Second Comparative Example parallel to the medium facing surface.

Next, first to fourth samples of an MR element of Second Comparative Example were prepared for the second experiment. FIG. 12 and Table 3 show the configuration of the MR element of Second Comparative Example.

TABLE 3

| Configuration of 2nd Comparative Example | | | Material | Thickness (nm) |
|---|---|---|---|---|
| 2nd antiferromagnetic layer 84 | | | IrMn | 7 |
| 2nd magnetization controlling layer 85 | 2nd ferromagnetic layer 86 | Magnetic layer | CoFe | 1 |
| | | Magnetic layer | NiFe | T2 |
| | | Magnetic layer | CoFe | 1 |

TABLE 3-continued

| Configuration of 2nd Comparative Example | | Material | Thickness (nm) |
|---|---|---|---|
| MR stack 5 | 2nd coupling layer 55 | Nonmagnetic conductive layer 55e | Ru | 0.8 |
| | | Magnetic layer 55d | CoFe | 1 |
| | | Nonmagnetic conductive layer 55c | Ru | 0.8 |
| | | Magnetic layer 55b | CoFe | 1 |
| | | Nonmagnetic conductive layer 55a | Ru | 0.8 |
| | 2nd free layer 54 | Magnetic layer | CoFe | 1.5 |
| | | Magnetic layer | CoFeB | 2 |
| | | Magnetic layer | CoFe | 1.5 |
| | Spacer layer 53 | | MgO | 1 |
| | 1st free layer 52 | Magnetic layer | CoFe | 1.5 |
| | | Magnetic layer | CoFeB | 2 |
| | | Magnetic layer | CoFe | 1.5 |
| | 1st coupling layer 51 | Nonmagnetic conductive layer 51e | Ru | 0.8 |
| | | Magnetic layer 51d | CoFe | 1 |
| | | Nonmagnetic conductive layer 51c | Ru | 0.8 |
| | | Magnetic layer 51b | CoFe | 1 |
| | | Nonmagnetic conductive layer 51a | Ru | 0.8 |
| 1st magnetization controlling layer 75 | 3rd ferromagnetic layer 78 | Magnetic layer | CoFe | 1 |
| | | Magnetic layer | NiFe | T1 |
| | | Magnetic layer | CoFe | 1 |
| | Nonmagnetic middle layer 77 | | Ru | 0.8 |
| | 1st ferromagnetic layer 76 | Magnetic layer | CoFe | 1 |
| | | Magnetic layer | NiFe | 12 |
| | | Magnetic layer | CoFe | 1 |
| 1st antiferromagnetic layer 74 | | | IrMn | 7 |

As shown in FIG. 12 and Table 3, the MR element of Second Comparative Example has a basic configuration without the underlayer 73 and the nonmagnetic cap layer 83 out of the MR element of Table 1. In addition, in the Second Comparative Example, the thickness T1 of the NiFe layer in the third ferromagnetic layer 78 and the thickness T2 of the NiFe layer in the second ferromagnetic layer 86 vary among the samples.

For the first to fourth samples, the thicknesses T1 and T2 of the NiFe layers were adjusted so that the exchange coupling magnetic field Hex acting on the third ferromagnetic layer 78 and the exchange coupling magnetic field Hex acting on the second ferromagnetic layer 86 were equal. The values of the exchange coupling magnetic field Hex in the first, second, third and fourth samples are 200 Oe, 300 Oe, 400 Oe and 450 Oe, respectively.

In the second experiment, the resolution and the standard deviation of the asymmetry were determined for each of the first to fourth samples. The resolution serves as an indicator that indicates the level of the ability of the ferromagnetic layers 78 and 86 as a shield, while the standard deviation of the asymmetry serves as an indicator that indicates the level of the ability of the ferromagnetic layers 78 and 86 to control the magnetizations of the free layers 52 and 54.

Table 4 shows the exchange coupling magnetic field Hex, the thicknesses T1 and T2 of the NiFe layers, the resolution and the standard deviation of the asymmetry for each of the first to fourth samples. In Table 4, the resolution is expressed as the value of the resolution when the exchange coupling magnetic field Hex is of any value divided by the value of the resolution when the exchange coupling magnetic field Hex is 200 Oe. The value of the resolution when the exchange coupling magnetic field Hex is 200 Oe is such a value that the function as a shield can be fully performed.

TABLE 4

| | Sample (without underlayer 73) | | | |
|---|---|---|---|---|
| | 1 | 2 | 3 | 4 |
| Hex (Oe) | 200 | 300 | 400 | 450 |
| T1 (nm) | 15 | 10 | 7 | 5 |
| T2 (nm) | 12 | 8 | 5 | 4 |
| Resolution | 1 | 1 | 0.8 | 0.75 |
| Standard deviation of asymmetry (%) | 18 | 17 | 11 | 11 |

As shown in Table 4, in the case without the underlayer 73, the resolution increases but the standard deviation of the asymmetry also increases as the exchange coupling magnetic field Hex decreases. This suggests that, in the case without the underlayer 73, as the exchange coupling magnetic field Hex decreases, the ferromagnetic layers 78 and 86 become incapable of fully performing the function of controlling the magnetizations of the free layers 52 and 54, while being capable of fully performing the function as a shield. Table 4 also indicate that, in the case without the underlayer 73, the standard deviation of the asymmetry decreases but the resolution also decreases as the exchange coupling magnetic field Hex increases. This suggests that, in the case without the underlayer 73, as the exchange coupling magnetic field Hex increases, the ferromagnetic layers 78 and 86 become incapable of fully performing the function as a shield, while being capable of fully performing the function of controlling the magnetizations of the free layers 52 and 54. Thus, in the case without the underlayer 73, it is difficult for the ferromagnetic layers 78 and 86 to fully perform both the function as a shield and the function of controlling the magnetizations of the free layers 52 and 54.

The recess 79 formed in the top surface 78a of the third ferromagnetic layer 78 can be a factor that makes the ferromagnetic layers 78 and 86 become incapable of fully performing the function as a shield as the exchange coupling magnetic field Hex increases in the case without the underlayer 73. To be more specific, if the ferromagnetic layer 78 is reduced in thickness in order to increase the exchange coupling magnetic field Hex, the thickness of the ferromagnetic layer 78 will be too small at the area where the recess 79 is formed. As a result, the ferromagnetic layer 78 will become effectively long in the track width direction, and will thereby have a magnetic shape anisotropy that orients the easy axis of magnetization to the track width direction. This reduces the responsiveness of the ferromagnetic layer 78 to an external magnetic field, and thereby impairs the function of the ferromagnetic layer 78 as a shield.

In the second experiment, next prepared were fifth to eighth samples each having a configuration with the underlayer 73 shown in Table 1 added to the MR element of Second Comparative Example having the configuration shown in Table 3, and the resolution and the standard deviation of the asymmetry were determined for each of those samples. For the fifth to eighth samples, the thicknesses T1 and T2 of the NiFe layers were adjusted so that the exchange coupling magnetic field Hex acting on the third ferromagnetic layer 78 and the exchange coupling magnetic field Hex acting on the second ferromagnetic layer 86 were equal. The values of the exchange coupling magnetic field Hex in the fifth, sixth, seventh and eighth samples are 200 Oe, 300 Oe, 400 Oe and 450 Oe, respectively.

Table 5 shows the exchange coupling magnetic field Hex, the thicknesses T1 and T2 of the NiFe layers, the resolution and the standard deviation of the asymmetry for each of the fifth to eighth samples. In Table 5, the resolution is expressed as the value of the resolution when the exchange coupling magnetic field Hex is of any value divided by the value of the resolution when the exchange coupling magnetic field Hex is 200 Oe. The value of the resolution when the exchange coupling magnetic field is 200 Oe is such a value that the function as a shield can be fully performed. Table 5 also shows the values of D2/D1.

TABLE 5

|  | Sample (with underlayer 73) | | | |
| --- | --- | --- | --- | --- |
|  | 5 | 6 | 7 | 8 |
| Hex (Oe) | 200 | 300 | 400 | 450 |
| T1 (nm) | 25 | 16 | 12 | 8.5 |
| T2 (nm) | 12 | 8 | 5 | 4 |
| Resolution | 1 | 1 | 1 | 0.8 |
| Standard deviation of asymmetry (%) | 18 | 17 | 11 | 11 |
| D2/D1 | 0.22 | 0.33 | 0.43 | 0.57 |

As can be seen from Table 4 and Table 5, if comparison is made for the same value of exchange coupling magnetic field Hex acting on the third ferromagnetic layer 78, it is shown that providing the underlayer 73 allows the thickness of the third ferromagnetic layer 78 to be greater compared with the case without the underlayer 73. This makes it possible that, even if the recess 79 is formed in the top surface 78a of the third ferromagnetic layer 78, the thickness of the third ferromagnetic layer 78 is prevented from being reduced too much at the area where the recess 79 is formed, and consequently the third ferromagnetic layer 78 can fully perform the function as a shield. This can also be seen from the fact that the resolution did not decrease even when the exchange coupling magnetic field Hex was increased to the order of 400 Oe, as shown in FIG. 5. However, if the value of D2/D1 exceeds 0.5 as in the eighth sample, the resolution decreases and accordingly the ability of the third ferromagnetic layer 78 as a shield becomes lower. Thus, in order to allow the third ferromagnetic layer 78 to fully perform the function as a shield, it is preferred that the depth D2 of the recess 79 be equal to or smaller than one-half of the distance D1 between the first portion 75a1 of the top surface 75a of the first magnetization controlling layer 75 and the bottom surface 78b of the third ferromagnetic layer 78.

As described above, providing the underlayer 73 makes it possible that, while the third ferromagnetic layer 78 is allowed to fully perform the function of controlling the magnetization of the free layer 52 by sufficiently increasing the exchange coupling magnetic field acting on the third ferromagnetic layer 78, the thickness of the third ferromagnetic layer 78 is prevented from being reduced too much, even if the recess 79 is formed in the top surface 78a of the third ferromagnetic layer 78, at the area where the recess 79 is formed. As a result, it becomes possible for the third ferromagnetic layer 78 to fully perform the function as a shield.

[Third Experiment]

In the third experiment, a ninth sample having a configuration with the nonmagnetic cap layer 83 added to the seventh sample shown in Table 5 was prepared and the standard deviation of the asymmetry was determined for the sample. The standard deviation of the asymmetry for the ninth sample was 10%, which was smaller than that for the seventh sample. This indicates that providing the nonmagnetic cap layer 83 serves to decrease the standard deviation of the asymmetry. Presumably, the reason why the standard deviation of the asymmetry is decreased by providing the nonmagnetic cap layer 83 is that the magnetic behavior of the second main shield layer 81 is prevented from being transmitted to the second antiferromagnetic layer 84 and the second antiferromagnetic layer 84 is thereby magnetically stabilized, which results in suppression of variations in the magnetization direction of the second ferromagnetic layer 86 and eventually results in suppression of variations in the magnetization direction of the second free layer 54.

As described so far, according to the present embodiment, it is possible to provide an MR element with a small read gap length, a high resolution, and reduced variations in asymmetry.

Figure 14:
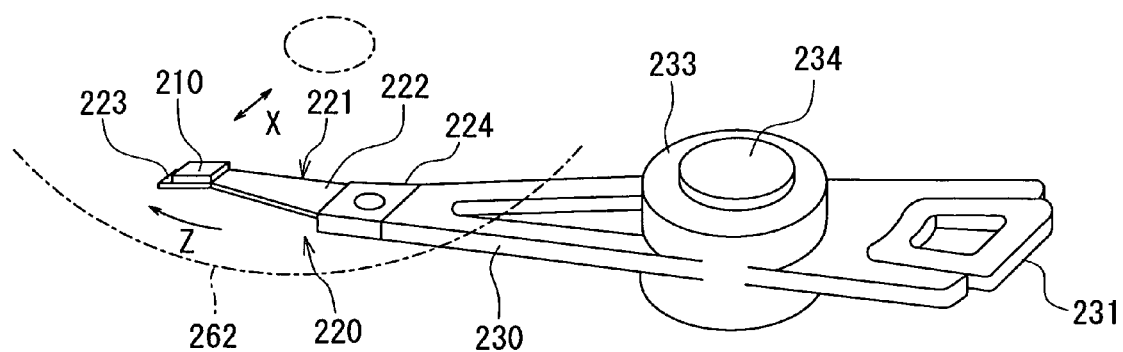
FIG. 14 is a perspective view of a head arm assembly of the first embodiment of the invention.

A head assembly and a magnetic disk drive of the present embodiment will now be described. Reference is now made to FIG. 14 to describe the head assembly of the present embodiment. The head assembly of the present embodiment includes the slider 210 shown in FIG. 13 and a supporter that flexibly supports the slider 210. Forms of this head assembly include a head gimbal assembly and a head arm assembly described below.

The head gimbal assembly 220 will be first described. The head gimbal assembly 220 has the slider 210 and a suspension 221 as the supporter that flexibly supports the slider 210. The suspension 221 has: a plate-spring-shaped load beam 222 formed of stainless steel, for example; a flexure 223 to which the slider 210 is joined, the flexure 223 being located at an end of the load beam 222 and giving an appropriate degree of freedom to the slider 210; and a base plate 224 located at the other end of the load beam 222. The base plate 224 is attached to an arm 230 of an actuator for moving the slider 210 along the x direction across the tracks of a magnetic disk platter 262. The actuator has the arm 230 and a voice coil motor that drives the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms with a plurality of head gimbal assemblies 220 respectively attached to the arms is called a head stack assembly.

FIG. 14 shows the head arm assembly of the present embodiment. In this head arm assembly, the head gimbal assembly 220 is attached to an end of the arm 230. A coil 231 that is part of the voice coil motor is fixed to the other end of the arm 230. A bearing 233 is provided in the middle of the arm 230. The bearing 233 is attached to a shaft 234 that rotatably supports the arm 230.

Figure 15:
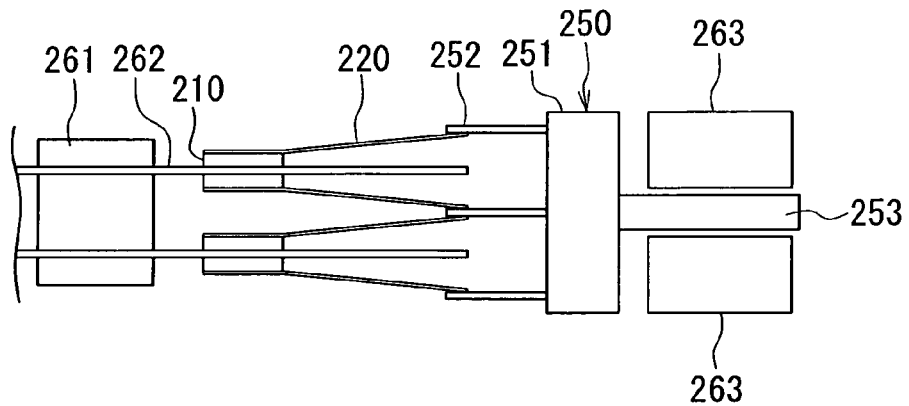
FIG. 15 is an illustrative view for illustrating a main part of a magnetic disk drive of the first embodiment of the invention.
Figure 16:
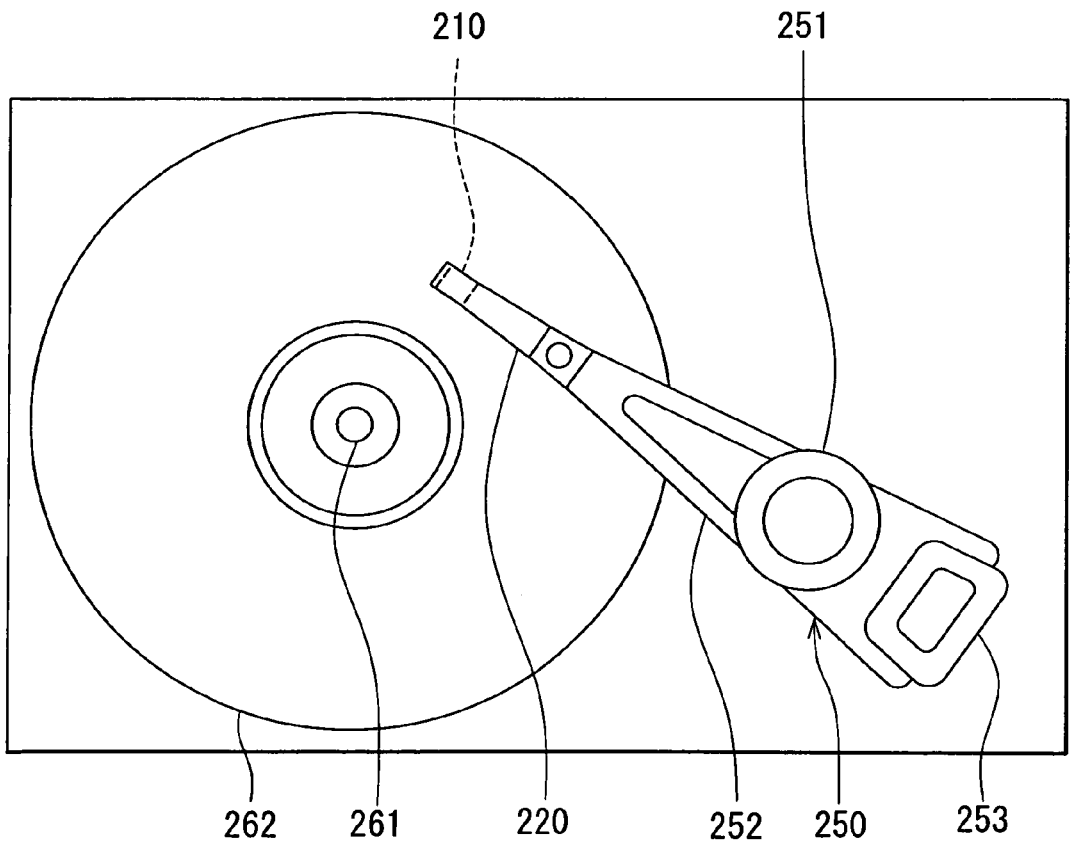
FIG. 16 is a plan view of the magnetic disk drive of the first embodiment of the invention.

Reference is now made to FIG. 15 and FIG. 16 to describe an example of the head stack assembly and the magnetic disk drive of the present embodiment. FIG. 15 is an illustrative view showing a main part of the magnetic disk drive, and FIG. 16 is a plan view of the magnetic disk drive. The head stack assembly 250 includes a carriage 251 having a plurality of arms 252. A plurality of head gimbal assemblies 220 are attached to the arms 252 such that the assemblies 220 are aligned in the vertical direction with spacing between every adjacent ones. A coil 253 that is part of the voice coil motor is mounted on a side of the carriage 251 opposite to the arms 252. The head stack assembly 250 is installed in the magnetic disk drive. The magnetic disk drive includes a plurality of magnetic disk platters 262 mounted on a spindle motor 261.

Two of the sliders 210 are allocated to each of the platters 262 such that the two sliders 210 are opposed to each other with a platter 262 disposed in between. The voice coil motor includes permanent magnets 263 disposed to be opposed to each other, the coil 253 of the head stack assembly 250 being placed between the magnets 263. The actuator and the head stack assembly 250 except the sliders 210 support the sliders 210 and align them with respect to the magnetic disk platters 262.

In the magnetic disk drive of the present embodiment, the actuator moves the slider 210 across the tracks of the magnetic disk platter 262 and aligns the slider 210 with respect to the magnetic disk platter 262. The thin-film magnetic head included in the slider 210 writes data on the magnetic disk platter 262 by using the write head, and reads data stored on the magnetic disk platter 262 by using the read head.

The head assembly and the magnetic disk drive of the present embodiment exhibit effects similar to those of the thin-film magnetic head of the embodiment described previously.

Second Embodiment

Figure 17:
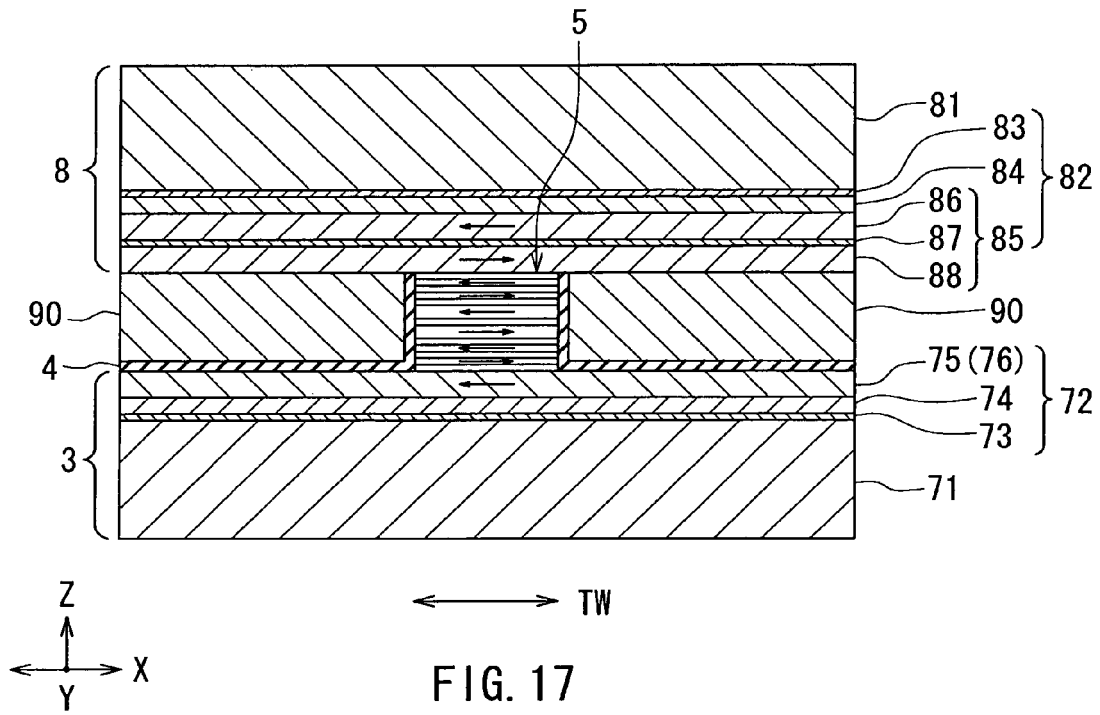
FIG. 17 is a cross-sectional view showing a cross section of a magnetoresistive element of a second embodiment of the invention parallel to the medium facing surface.
Figure 18:
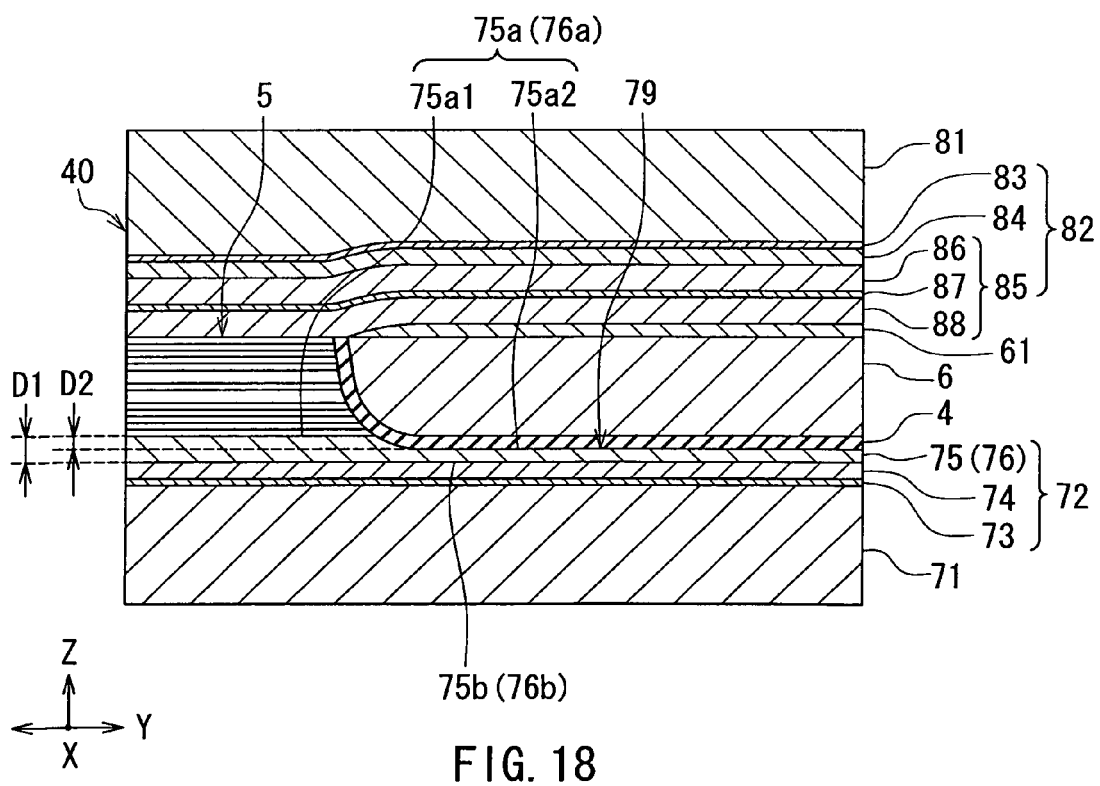
FIG. 18 is a cross-sectional view showing a cross section of the magnetoresistive element of FIG. 17 perpendicular to the medium facing surface and the top surface of the substrate.

Reference is now made to FIG. 17 and FIG. 18 to describe an MR element of a second embodiment of the present invention. FIG. 17 is a cross-sectional view showing a cross section of the MR element of the second embodiment parallel to the medium facing surface 40. FIG. 18 is a cross-sectional view showing a cross section of the MR element of the second embodiment perpendicular to the medium facing surface 40 and the top surface of the substrate 1. The X, Y and Z directions shown in FIG. 13 are also shown in FIG. 17 and FIG. 18. In FIG. 17 the Y direction is orthogonal to the X and Z directions. In FIG. 18 the X direction is orthogonal to the Y and Z directions. In FIG. 17 the arrow TW indicates the track width direction.

In the second embodiment, the first magnetization controlling layer 75 includes only the first ferromagnetic layer 76 that is exchange-coupled to the first antiferromagnetic layer 74. The nonmagnetic conductive layer 51a of the first coupling layer 51 touches the first ferromagnetic layer 76. In the second embodiment, the second magnetization controlling layer 85 includes: the second ferromagnetic layer 86 that is exchange-coupled to the second antiferromagnetic layer 84; a nonmagnetic middle layer 87 made of a nonmagnetic conductive material and disposed between the second ferromagnetic layer 86 and the MR stack 5; and a third ferromagnetic layer 88 disposed between the nonmagnetic middle layer 87 and the MR stack 5. The third ferromagnetic layer 88 is antiferromagnetically exchange-coupled to the second ferromagnetic layer 86 by the RKKY interaction through the nonmagnetic middle layer 87. The third ferromagnetic layer 88 touches the nonmagnetic conductive layer 55e of the second coupling layer 55.

In the second embodiment, the first ferromagnetic layer 76 has a top surface 76a that forms the top surface 75a of the first magnetization controlling layer 75, and a bottom surface 76b that forms the bottom surface 75b of the first magnetization controlling layer 75 and touches the first antiferromagnetic layer 74. The recess 79 is formed in the top surface 76a of the first ferromagnetic layer 76. The depth D2 of the recess 79 is preferably equal to or smaller than one-half of the distance D1 between the first portion 75a1 of the top surface 75a of the first magnetization controlling layer 75 and the bottom surface 76b of the first ferromagnetic layer 76.

Table 6 shows a specific example of configurations of the first exchange coupling shield layer 72, the MR stack 5 and the second exchange coupling shield layer 82 of the second embodiment.

TABLE 6

| Configuration | | | Material | Thickness (nm) |
|---|---|---|---|---|
| Nonmagnetic cap layer 83 | | | NiCr | 2 |
| 2nd antiferromagnetic layer 84 | | | IrMn | 7 |
| 2nd magnetization controlling layer 85 | 2nd ferromagnetic layer 86 | Magnetic layer | CoFe | 1 |
| | | Magnetic layer | NiFe | 12 |
| | | Magnetic layer | CoFe | 1 |
| | Nonmagnetic middle layer 87 | | Ru | 0.8 |
| | 3rd ferromagnetic layer 88 | Magnetic layer | CoFe | 1 |
| | | Magnetic layer | NiFe | 15 |
| | | Magnetic layer | CoFe | 1 |
| MR stack 5 | 2nd coupling layer 55 | Nonmagnetic conductive layer 55e | Ru | 0.8 |
| | | Magnetic layer 55d | CoFe | 1 |
| | | Nonmagnetic conductive layer 55c | Ru | 0.8 |
| | | Magnetic layer 55b | CoFe | 1 |
| | | Nonmagnetic conductive layer 55a | Ru | 0.8 |
| | 2nd free layer 54 | Magnetic layer | CoFe | 1.5 |
| | | Magnetic layer | CoFeB | 2 |
| | | Magnetic layer | CoFe | 1.5 |
| | Spacer layer 53 | | MgO | 1 |
| | 1st free layer 52 | Magnetic layer | CoFe | 1.5 |
| | | Magnetic layer | CoFeB | 2 |
| | | Magnetic layer | CoFe | 1.5 |
| | 1st coupling layer 51 | Nonmagnetic conductive layer 51e | Ru | 0.8 |
| | | Magnetic layer 51d | CoFe | 1 |
| | | Nonmagnetic conductive layer 51c | Ru | 0.8 |
| | | Magnetic layer 51b | CoFe | 1 |
| | | Nonmagnetic conductive layer 51a | Ru | 0.8 |
| 1st magnetization controlling layer 75 | 1st ferromagnetic layer 76 | Magnetic layer | CoFe | 1 |
| | | Magnetic layer | NiFe | 15 |
| | | Magnetic layer | CoFe | 1 |
| 1st antiferromagnetic layer 74 | | | IrMn | 7 |
| Underlayer 73 | | Nonmag. conductive layer | Ru | 2 |
| | | Nonmag. conductive layer | Ta | 1 |

In this example, the depth D2 of the recess 79 was set to 6 nm. The distance D1 between the first portion 75a1 of the top surface 75a of the first magnetization controlling layer 75 and the bottom surface 76b of the first ferromagnetic layer 76 is equal to the thickness of the first ferromagnetic layer 76, i.e., 17 nm. The depth D2 of the recess 79 thus satisfies the requirement that the depth D2 be equal to or smaller than one-half of the distance D1. The remainder of conditions for this example are the same as those for the MR element of the first embodiment.

According to the second embodiment, in the first exchange coupling shield layer 72, the first ferromagnetic layer 76 is exchange-coupled to the first antiferromagnetic layer 74, whereby the direction of the magnetization of the first ferromagnetic layer 76 is set. On the other hand, in the second exchange coupling shield layer 82, the second ferromagnetic layer 86 is exchange-coupled to the second antiferromagnetic layer 84 and the third ferromagnetic layer 88 is antiferromagnetically exchange-coupled to the second ferromagnetic layer 86 through the nonmagnetic middle layer 87, whereby the direction of the magnetization of the third ferromagnetic layer 88 is set. As a result, the magnetizations of the first ferromagnetic layer 76 and the third ferromagnetic layer 88 are directed antiparallel to each other.

According to the second embodiment, by providing the first exchange coupling shield layer 72 with the underlayer 73, it is possible to increase the exchange coupling magnetic field acting on the first ferromagnetic layer 76 compared with the case without the underlayer 73. Therefore, if comparison is made for the same value of exchange coupling magnetic field acting on the first ferromagnetic layer 76, the second embodiment allows the first ferromagnetic layer 76 to be greater in thickness than in the case without the underlayer 73. Consequently, according to the second embodiment, even if the recess 79 is formed in the top surface 75a of the first magnetization controlling layer 75, i.e., the top surface 76a of the first ferromagnetic layer 76, it is possible to prevent the thickness of the first ferromagnetic layer 76 from being reduced too much at the area where the recess 79 is formed. As a result, it is possible for the first ferromagnetic layer 76 to fully perform its function as a shield.

The MR element of the second embodiment was tested in similar experiments to the first to third experiments performed for the first embodiment, and similar results to those for the first embodiment were obtained.

The remainder of configuration, function and effects of the second embodiment are similar to those of the first embodiment.

The present invention is not limited to the foregoing embodiments but can be carried out in various modifications. For example, while each of the foregoing embodiments has shown an example in which the spacer layer is a tunnel barrier layer, the spacer layer of the present invention may be a nonmagnetic conductive layer, or may be a spacer layer of the current-confined-path type that includes a portion allowing the passage of currents and a portion intercepting the passage of currents.

While the foregoing embodiments have been described with reference to a thin-film magnetic head having a structure in which the read head is formed on the base body and the write head is stacked on the read head, the read head and the write head may be stacked in the reverse order. If the thin-film magnetic head is to be used only for read operations, the thin-film magnetic head may be configured to include the read head only.

The present invention is applicable not only to MR elements used as read heads of thin-film magnetic heads, but also to MR elements used for various purposes in general.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A magnetoresistive element comprising:
a first shield portion and a second shield portion; and
an MR stack disposed between the first and second shield portions, wherein:
the MR stack and the second shield portion are stacked in this order on the first shield portion;
the first shield portion includes a first main shield layer, and a first exchange coupling shield layer disposed between the first main shield layer and the MR stack;
the second shield portion includes a second main shield layer, and a second exchange coupling shield layer disposed between the second main shield layer and the MR stack;
the first exchange coupling shield layer includes: an underlayer made of a nonmagnetic conductive material and disposed on the first main shield layer; a first antiferromagnetic layer disposed on the underlayer; and a first magnetization controlling layer disposed between the first antiferromagnetic layer and the MR stack;
the second exchange coupling shield layer includes: a second antiferromagnetic layer; and a second magnetization controlling layer disposed between the second antiferromagnetic layer and the MR stack;
the MR stack includes: a first free layer that is magnetically coupled to the first magnetization controlling layer and thereby has a magnetization in a controlled direction; a second free layer that is magnetically coupled to the second magnetization controlling layer and thereby has a magnetization in a controlled direction; and a spacer layer made of a nonmagnetic material and disposed between the first and second free layers;
the first magnetization controlling layer includes a first ferromagnetic layer exchange-coupled to the first antiferromagnetic layer;
the second magnetization controlling layer includes a second ferromagnetic layer exchange-coupled to the second antiferromagnetic layer; and
only one of the first and second magnetization controlling layers further includes: a nonmagnetic middle layer made of a nonmagnetic conductive material and disposed between the first or second ferromagnetic layer and the MR stack: and a third ferromagnetic layer disposed between the nonmagnetic middle layer and the MR stack and antiferromagnetically exchange-coupled to the first or second ferromagnetic layer through the nonmagnetic middle layer.

2. The magnetoresistive element according to claim 1, wherein the underlayer contains at least one of Ta and Ru.

3. The magnetoresistive element according to claim 1, wherein the nonmagnetic middle layer contains at least one of Ru, Rh, Ir, Cr, Cu, Ag, Au, Pt and Pd.

4. The magnetoresistive element according to claim 1, wherein the second exchange coupling shield layer further includes a nonmagnetic cap layer made of a nonmagnetic conductive material and disposed between the second antiferromagnetic layer and the second main shield layer.

5. The magnetoresistive element according to claim 1, wherein the MR stack further includes: a first coupling layer disposed between the first magnetization controlling layer and the first free layer and magnetically coupling the first magnetization controlling layer and the first free layer to each other; and a second coupling layer disposed between the second magnetization controlling layer and the second free layer and magnetically coupling the second magnetization controlling layer and the second free layer to each other.

6. The magnetoresistive element according to claim 5, wherein each of the first and second coupling layers includes a nonmagnetic conductive layer, and two magnetic layers sandwiching the nonmagnetic conductive layer.

7. The magnetoresistive element according to claim 1, further comprising a bias magnetic field applying layer disposed between the first and second shield portions so as to be adjacent to the MR stack in a direction orthogonal to a direction in which the layers constituting the MR stack are stacked, the bias magnetic field applying layer applying a bias magnetic field to the first and second free layers so that the magnetizations of the first and second free layers change their directions compared with a state in which no bias magnetic field is applied to the first and second free layers.

8. The magnetoresistive element according to claim 7, wherein the bias magnetic field applying layer applies the bias magnetic field to the first and second free layers so that the magnetizations of the first and second free layers are directed orthogonal to each other.

9. The magnetoresistive element according to claim 7, wherein the first magnetization controlling layer has a top surface and a bottom surface, the top surface including a first portion that touches the MR stack and a second portion that is located closer to the bottom surface than is the first portion so that a recess is formed below the bias magnetic field applying layer, the magnetoresistive element further comprising an insulating film disposed on the second portion, wherein the bias magnetic field applying layer is disposed on the insulating film.

10. The magnetoresistive element according to claim 9, wherein:

the first magnetization controlling layer includes the nonmagnetic middle layer and the third ferromagnetic layer;

the third ferromagnetic layer has a top surface that forms the top surface of the first magnetization controlling layer, and a bottom surface that touches the nonmagnetic middle layer; and the recess has a depth equal to or smaller than one-half of a distance between the first portion and the bottom surface of the third ferromagnetic layer.

11. The magnetoresistive element according to claim 9, wherein:

the second magnetization controlling layer includes the nonmagnetic middle layer and the third ferromagnetic layer;

the first ferromagnetic layer has a top surface that forms the top surface of the first magnetization controlling layer, and a bottom surface that touches the first antiferromagnetic layer; and the recess has a depth equal to or smaller than one-half of a distance between the first portion and the bottom surface of the first ferromagnetic layer.

12. A thin-film magnetic head comprising: a medium facing surface that faces toward a recording medium; and the magnetoresistive element according to claim 1, the magnetoresistive element being disposed near the medium facing surface to detect a signal magnetic field sent from the recording medium.

13. A head assembly comprising: a slider including a thin-film magnetic head and disposed to face toward a recording medium; and a supporter flexibly supporting the slider, the thin-film magnetic head comprising: a medium facing surface that faces toward the recording medium; and the magnetoresistive element according to claim 1, the magnetoresistive element being disposed near the medium facing surface to detect a signal magnetic field sent from the recording medium.

14. A magnetic disk drive comprising: a slider including a thin-film magnetic head and disposed to face toward a recording medium that is driven to rotate; and an alignment device supporting the slider and aligning the slider with respect to the recording medium, the thin-film magnetic head comprising: a medium facing surface that faces toward the recording medium; and the magnetoresistive element according to claim 1, the magnetoresistive element being disposed near the medium facing surface to detect a signal magnetic field sent from the recording medium.

* * * * *